US00RE50736E

(19) United States
(12) Reissued Patent
Lee

(10) Patent Number: US RE50,736 E
(45) Date of Reissued Patent: Jan. 6, 2026

(54) DISPLAY PANEL AND METHOD FOR ELECTRICALLY-ISOLATING LIGHT EMITTING DIODE IN DISPLAY PANEL

(71) Applicant: LG Display Co., Ltd., Seoul (KR)

(72) Inventor: Shin-Bok Lee, Seoul (KR)

(73) Assignee: LG Display Co., Ltd., Seoul (KR)

(21) Appl. No.: 18/061,384

(22) Filed: Dec. 2, 2022

Related U.S. Patent Documents

Reissue of:
(64) Patent No.: 10,872,559
Issued: Dec. 22, 2020
Appl. No.: 16/659,483
Filed: Oct. 21, 2019

(30) Foreign Application Priority Data

Dec. 24, 2018 (KR) ..... 10-2018-0127585

(51) Int. Cl.
*G09G 3/32* (2016.01)
*H01L 23/525* (2006.01)

(52) U.S. Cl.
CPC ..... *G09G 3/32* (2013.01); *H01L 23/5256* (2013.01); *G09G 2310/0267* (2013.01); *G09G 2310/0275* (2013.01)

(58) Field of Classification Search
CPC ..... G09G 3/32
See application file for complete search history.

(56) References Cited

U.S. PATENT DOCUMENTS 9,728,127 B2 8/2017 In et al.
2002/0036471 A1* 3/2002 Silvestre ..... G09G 3/30 315/160
2004/0227704 A1* 11/2004 Wang ..... G09G 3/3233 345/76
2008/0062096 A1* 3/2008 Yamashita ..... G09G 3/2074 345/82
2012/0162165 A1* 6/2012 Lee ..... G09G 3/006 345/206
2014/0367633 A1* 12/2014 Bibl ..... H01L 25/0753 257/13
2015/0103070 A1 4/2015 In et al. ..... G09G 3/3233 345/76
2015/0318328 A1* 11/2015 Bibl ..... H01L 51/50 257/89
2016/0217720 A1 7/2016 Chaji
2017/0270852 A1* 9/2017 Meitl ..... G09G 3/3216
(Continued)

FOREIGN PATENT DOCUMENTS

JP H08137413 A 5/1996
KR 10-2005-0106580 A 11/2005
(Continued)

*Primary Examiner* — Cameron Saadat
(74) *Attorney, Agent, or Firm* — Seed Intellectual Property Law Group LLP

(57) ABSTRACT

The present disclosure relates to a display panel and a method for electrical-isolation of a light-emitting diode in the display panel. In one embodiment, a display panel includes an element region contained in each sub-pixel, wherein two or more light-emitting diodes are arranged in the element region; and two or more e-fuses respectively connected to the two or more light-emitting diodes, wherein at least one of the two or more e-fuses has blown; and two or more e-fuse transistors respectively connected to the two or more e-fuses.

23 Claims, 14 Drawing Sheets

(56) References Cited

U.S. PATENT DOCUMENTS

| | | | | |
|---|---|---|---|---|
| 2018/0007750 | A1* | 1/2018 | Meitl | H01L 33/62 |
| 2018/0182286 | A1* | 6/2018 | Ahmed | G09G 3/3283 |
| 2020/0152826 | A1* | 5/2020 | Lee | G09G 3/3225 |

FOREIGN PATENT DOCUMENTS

| | | | |
|---|---|---|---|
| KR | 20050106580 | A | 11/2005 |
| KR | 10-1210285 | B1 | 12/2012 |
| KR | 20150042914 | A | 4/2015 |
| KR | 10-1766184 | B1 | 8/2017 |
| KR | 10-1820275 | B1 | 1/2018 |

* cited by examiner 21 22

FIG. 11

143

141

| | 0 | 1 | 2 | | | | m |
|---|---|---|---|---|---|---|---|
| 0 | 2 | 2 | 1 | | | | 1 |
| 1 | 2 | 1 | 1 | | | | 2 |
| 2 | 2 | 1 | 1 | | | | 2 |
| | | | | | | | |
| n | 1 | 2 | 1 | | | | 1 |

142

| | 0 | 1 | 2 | | | | m |
|---|---|---|---|---|---|---|---|
| 0 | 2,3 | 1,3 | 1,2 | | | | 2,3 |
| 1 | 1,2 | 1,3 | 1,3 | | | | 1,2 |
| | | | | | | | |
| n | 1,3 | 2,3 | 2,3 | | | | 1,2 |

DISPLAY PANEL AND METHOD FOR ELECTRICALLY-ISOLATING LIGHT EMITTING DIODE IN DISPLAY PANEL

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

This application is based on and claims the benefit of priority to Korean Patent Application No. 10-2018-0127585, filed on Oct. 24, 2018, in the Korean Intellectual Property Office, the disclosure of which is incorporated herein in its entirety by reference.

BACKGROUND

Technical Field

The present disclosure relates to a display panel and a method for electrical-isolation of a light-emitting diode in a display panel, preferably in the display panel.

Description of the Related Art

A display device refers to a device that visually displays data and provides other additional functions by using display panels. Various types of display panels may be combined with devices such as mobile phones, tablets, TVs, and the like.

Various types of display panels may include a liquid crystal display, LCD, panel, an electrophoretic display panel, an organic light emitting display panel, an electro luminescent display panel, a field emission display panel, a surface-conduction electron-emitter display panel, a plasma display panel, a micro led panel, etc.

Among these display panels, the organic light emitting display panel is a self-emitting display panel in an organic compound is excited to emit light. The organic light emitting display panel does not require a backlight as for instance used in an LCD panel. This is advantageous in that the OLED panel may be made lighter and thinner compared to other panel technologies and a production process thereof may be simplified. However, since the organic light emitting display panel uses an organic light emitting diode (OLED) that uses an organic material, the OLED panel is vulnerable to permeation of moisture, liquids (such as water), and oxygen. In order to solve this problem, encapsulation technologies are applied. However, sealing tightness may not meet a required level such that a reliability of a product may not be secured.

In recent years, research has been conducted on a light emitting diode display device using a light emitting diode, LED, element made of an inorganic material or the like. The LED element has high light conversion efficiency, and thus has very low energy consumption. Further, the LED element is semi-permanent and environmentally friendly and has a long service life.

A light emitting diode display device referred to herein is a display device implemented by placing at least one LED element, for instance a micro LED element, per pixel on a thin film transistor substrate. Such a LED display device is advantageous in that it may utilize the above advantage of the LED element without degrading a luminous efficiency. Currently, efforts are being made to commercialize micro LED element based display devices.

In order to suppress defective pixels in manufacturing of such light emitting diode display devices, a redundancy structure may be employed in which two or more micro LED elements are arranged per pixel. However, there is a problem that the number of driving circuits increases in such a redundancy structure. Further, this redundancy structure complicates a structure of wirings and causes transmittance of an entire panel to be lowered.

BRIEF SUMMARY

The present disclosure provides a display panel in which light-emitting diodes are duplicated with each other to eliminate defective pixels in the display panel to improve performance of the display panel without introducing the aforementioned problems.

The present disclosure further provides a redundant micro LED display panel in which an aperture ratio increases in the redundant micro LED display panel.

In addition, the present disclosure provides a redundant LED display panel in which the number of wirings and transistors on the panel is reduced to decrease the manufacturing costs and a circuit complexity of the display panel of the device.

The advantages of the present disclosure are not limited to the above. Other advantages of the present disclosure that are not mentioned may be understood by following descriptions, and will be more clearly understood by embodiments of the present disclosure. It is to be further understood that the purposes and advantages of the present disclosure may be realized and attained by means of means and combinations thereof recited in the appended claims.

In one embodiment of the present disclosure, a display panel includes an element region contained in each sub-pixel, wherein two or more light-emitting diodes are arranged in the element region; and two or more e-fuses respectively connected to the two or more light-emitting diodes, wherein at least one of the two or more e-fuses has blown; and two or more e-fuse transistors respectively connected to the two or more e-fuses.

According to one embodiment of the present disclosure, a gate node of each e-fuse transistor is connected to one of a scan signal line or a light-emission control signal line, optionally or an e-fuse scan signal line extending in a first direction, wherein source nodes of the two or more e-fuse transistors are all connected to a signal line extending in a second direction.

According to one embodiment of the present disclosure, a fusing transistor is placed in each sub-pixel, and an e-fuse control signal line extending in the first direction is connected to a gate node of the fusing transistor, and a source node of the fusing transistor is connected to the data line, and a drain node of the fusing transistor is connected to source nodes of the first and second e-fuse transistors.

According to one embodiment of the present disclosure, a display panel includes an element region contained in each sub-pixel, wherein two or more light-emitting diodes are arranged in the element region; and two or more e-fuses respectively connected to the two or more light-emitting diodes, wherein at least one of the two or more e-fuses has blown; two or more e-fuse transistors respectively connected to the two or more e-fuses; and a spare region in which one light-emitting diode is currently absent but subsequently present.

According to one embodiment of the present disclosure, a method for electrically-isolating a light-emitting diode in a display panel includes: reading, by a timing controller, information about a light-emitting diode to be electrical-isolated among two light-emitting diodes within each sub-pixel; applying, by the timing controller, a signal for fusing a first e-fuse to a data line to each sub-pixel in which a first light-emitting diode to be electrically-isolated is connected to the first e-fuse, and a first scan signal line is connected to the first e-fuse; applying, by the timing controller, a signal for turning on a first e-fuse transistor connected to the first e-fuse to the first scan signal line and applying a signal for activating a first fusing transistor to a first e-fuse control signal line; applying, by the timing controller, a signal for fusing a second e-fuse to a data line to each sub-pixel in which a second light-emitting diode to be electrically-isolated is connected to the second e-fuse, and a first light emission control signal line is connected to the second e-fuse; and applying, by the timing controller, a signal for turning on a second e-fuse transistor connected to the second e-fuse to the first light emission control signal line, and applying a signal for activating a second fusing transistor to a second e-fuse control signal line.

According to one embodiment of the present disclosure, a method for electrically-isolating a light-emitting diode in a display panel includes: reading, by a timing controller, information about a light-emitting diode to be electrically-isolated among a plurality of light-emitting diodes in each sub-pixel; applying, by the timing controller, a signal to either a first scan signal line, a first light-emission control signal line, or an e-fuse scan signal line based on the readout information to turn on an e-fuse transistor corresponding to the light-emission diode to be electrically-isolated; and applying, by the timing controller, a signal for blowing an e-fuse connected to the e-fuse transistor to a signal line connected to a source node of the e-fuse transistor, thereby to blow the e-fuse.

Herein, an e-fuse may refer to an electrical fuse. In electronics and electrical engineering, an e-fuse may be an electrical safety device that operates to provide overcurrent protection of an electrical circuit. However, in some embodiments of the disclosure, an electrical fuse (e-fuse) may be used to maintain or to interrupt an electrical connection, so it may have the function of a permanent switch.

In one or more embodiments, each e-fuse has two terminals, connected to elements of one sub-pixel of the display panel. A first terminal of an e-fuse may be connected to a light-emitting diode, for example, a cathode thereof. A second terminal of an e-fuse may be connected to a voltage line for supplying a low voltage supply signal. Additionally or alternatively, the first terminal of an e-fuse may be connected to a light-emitting diode, for example, an anode thereof. A second terminal of an e-fuse may be connected to a voltage line for supplying a high voltage supply signal.

An e-fuse has a first state (e.g., blown-state, disconnected-state) and a second state (e.g., non-blown-state, connected-state). In the non-blown-state, the e-fuse provides an electrical connection between its two terminals in the display panel. In the non-blown state, an electrical signal can directly be transferred between its two terminals of the e-fuse due to the established electrical connection. However, in the blown-state (herein also referred to as "e-fuse has blown"), an electrical connection is interrupted permanently. Thus, in the blown state, an electrical signal cannot be transferred between the two terminals of the e-fuse due to the interruption of the electrical connection.

Accordingly, the e-fuse may be in a non-blown state and after providing a blowing-signal to the e-fuse, the e-fuse may permanently switch to the blown-state (on purpose). Thus, the switching of the e-fuse into the blown-state may occur only once per e-fuse and may be irreversible.

In accordance with the present disclosure, the light-emitting diodes may be placed redundantly to eliminate defective pixels in the display panel and to maximize the performance of the display panel.

Further, in accordance with the present disclosure, the aperture ratio of the display panel may be improved by disposing the driving circuit independently of the number of the light-emitting diodes arranged in each sub-pixel.

Furthermore, in accordance with the present disclosure, the number of the wirings and transistors may be reduced or minimized on the display panel having the redundant LED structure to reduce the manufacturing cost and circuit complexity thereof.

Further specific effects of the present disclosure as well as the effects as described above will be described in conduction with illustrations of specific details for carrying out the disclosure.

BRIEF DESCRIPTION OF THE SEVERAL VIEWS OF THE DRAWINGS

FIG. 11 shows a memory information according to one embodiment of the present disclosure.

DETAILED DESCRIPTION

Figure 1:
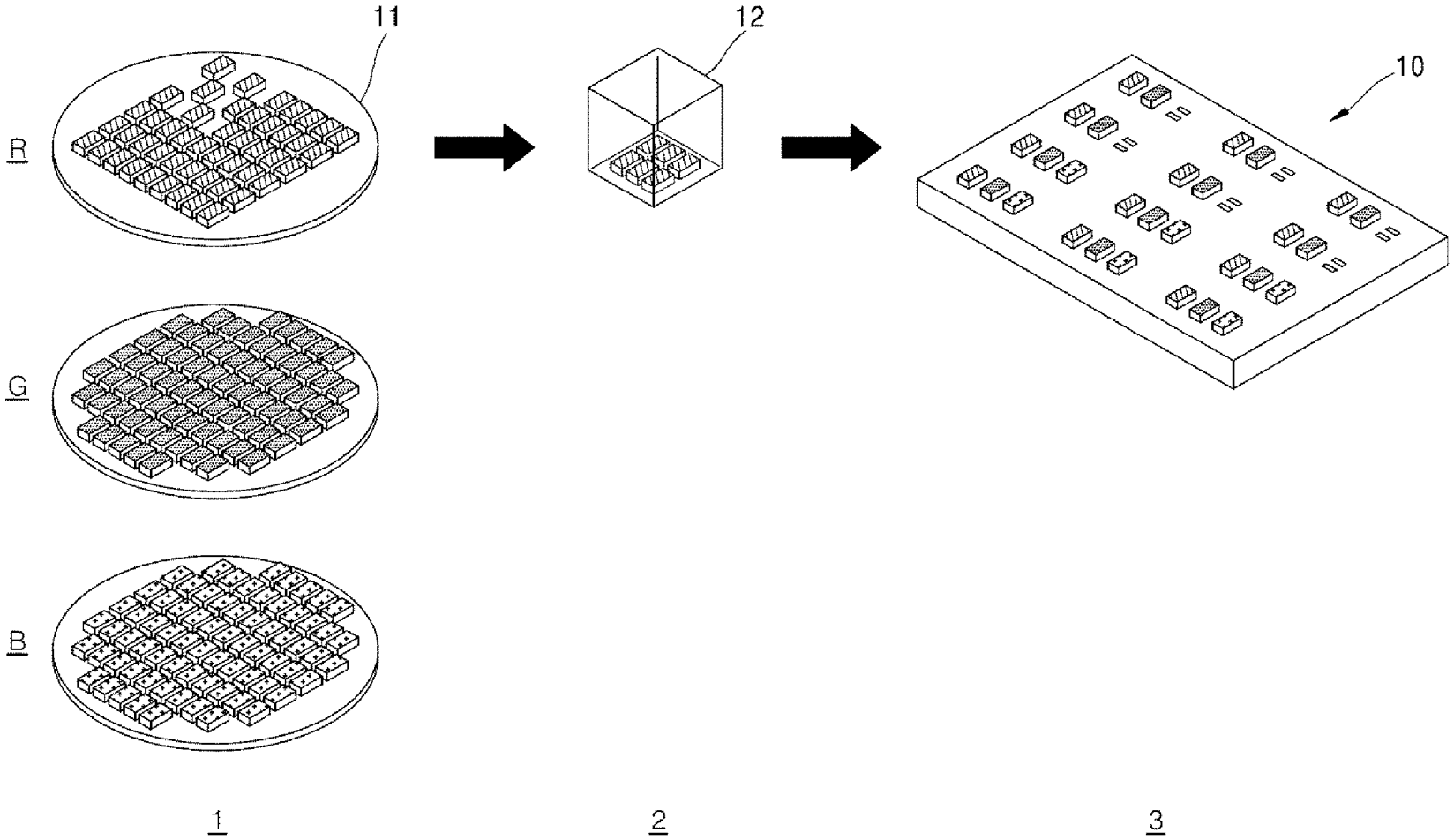
FIG. 1 shows a process of transferring a micro LED element to a substrate.

Hereinafter, a display panel and a method for electrical-isolation of a light-emitting diode therein in accordance with the present disclosure will be described with reference to the accompanying drawings.

For simplicity and clarity of illustration, elements in the figures are not necessarily drawn to scale. The same reference numbers in different figures denote the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Embodiments are described in sufficient detail to enable those skilled in the art in the art to easily practice the technical idea of the present disclosure. It is intended to cover alternatives, modifications, and equivalents as may be included within the scope of the present disclosure.

Unless defined otherwise, all terms used herein have the same meaning as commonly understood by one of ordinary skill in the art. When the terms used herein are in conflict with a general meaning of the term, the meaning of the term is in accordance with a definition used herein.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the scope of the present disclosure.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Hereinafter, a light-emitting diode, LED, arranged in a display device may be referred to as a micro LED chip or LED chip for short. Those terms may be exchangeable with each other and refer to the same configuration. Further, embodiments presented herein may be applied to display panels implemented in various ways. Therefore, e-fuse configuration may be applied to various display panels having a LED redundancy structure to select and turn on only a specific light emitting region.

FIG. 1 shows a process of transferring a light-emitting diode of a light-emitting diode display device to a substrate.

A numeral 1 in FIG. 1 shows a configuration in which light-emitting diodes for emitting red R/green G/blue B light beams respectively are disposed on a wafer 11. Not only a wafer made of sapphire but also a wafer made of each of various materials may be employed. Each of the light-emitting diodes for emitting R/G/B light beams may be disposed on a corresponding area on the wafer 11. The light-emitting diodes are transferred onto the substrate 10 shown in a numeral 3 using a transfer device such as a stamp 12 as shown in a numeral 2. The numeral 3 shows a configuration in which light-emitting diodes for emitting R/G/B light beams respectively are disposed on a substrate 10 as a glass substrate by way of example.

The display device in which a pixel is configured using a light-emitting diode as shown in FIG. 1 may be referred to as a micro LED display device. In a manufacturing process of the display panel, a light-emitting diode with a micro size is transferred to the substrate (backplane) 10 to configure the pixel. In this connection, a chip or element defect may occur in the process of transferring the LED element to the substrate 10. This defect may lead to a defective pixel. Therefore, a repair structure or a redundancy structure is adopted to cope with such defective pixels.

To address this defect, one or more embodiments of the present disclosure places only one driver circuit on each sub-pixel in a redundancy structure where two or more light-emitting diodes are transferred to each sub-pixel. This may reduce production costs and increase light transmission, which may not be otherwise the case in having double driving elements on each sub-pixel.

Figure 7:
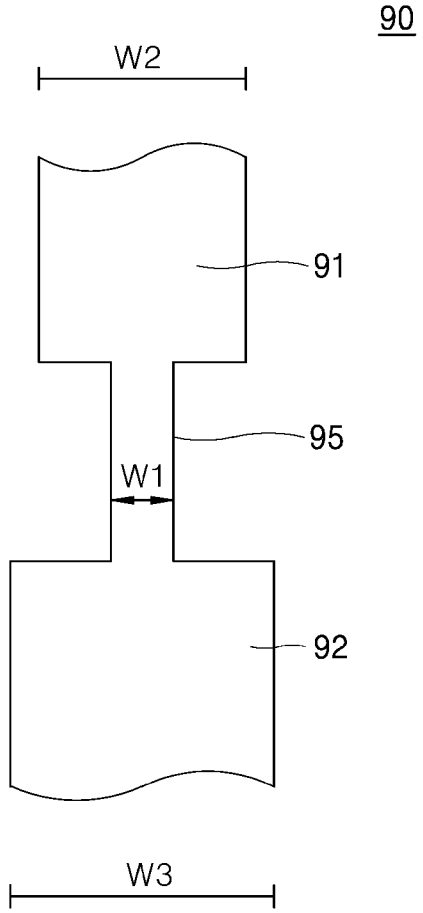
FIG. 7 shows a configuration of an e-fuse (electrical fuse) according to one embodiment of the present disclosure.

To this end, the light-emitting diodes are transferred onto the substrate 10. Then, a malfunctioning or non-operating LED element may be detected via a test. Then, disconnection between the malfunctioning or non-operating or unnecessary LED element and the driving circuit may be executed. An e-fuse is connected to each light-emitting diode to implement the disconnection. An example of an e-fuse (electrical fuse) is shown in FIG. 7.

Figure 2:
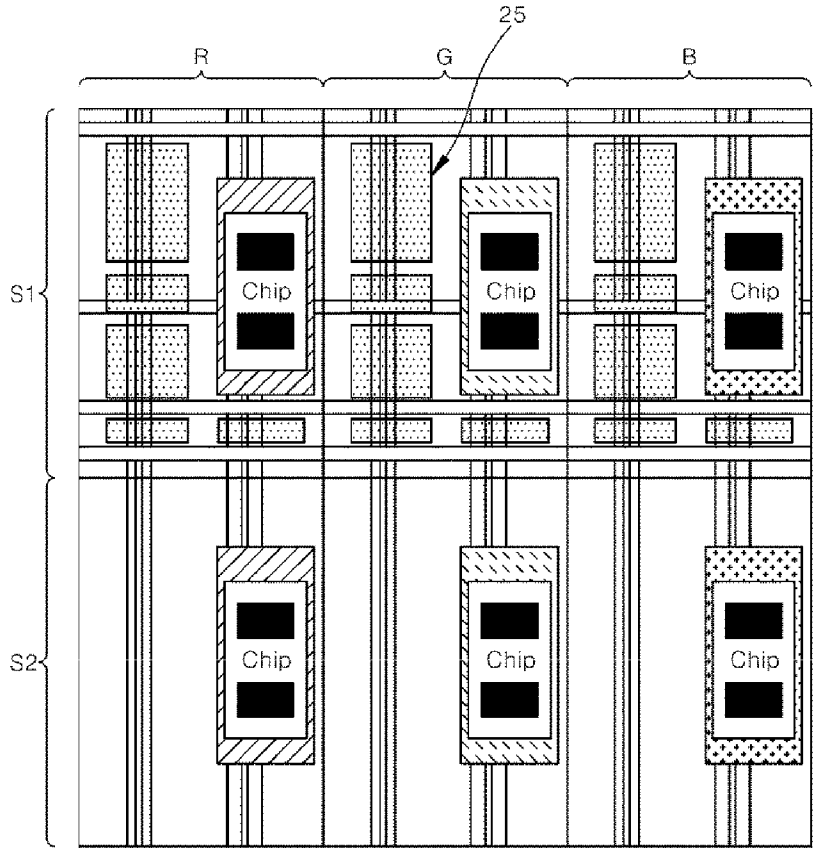
FIG. 2 shows comparison between a case where a driving circuit is placed in each redundancy structure and a case where a single driving circuit is arranged in a single pixel according to an embodiment of the present disclosure.
Figure 2:
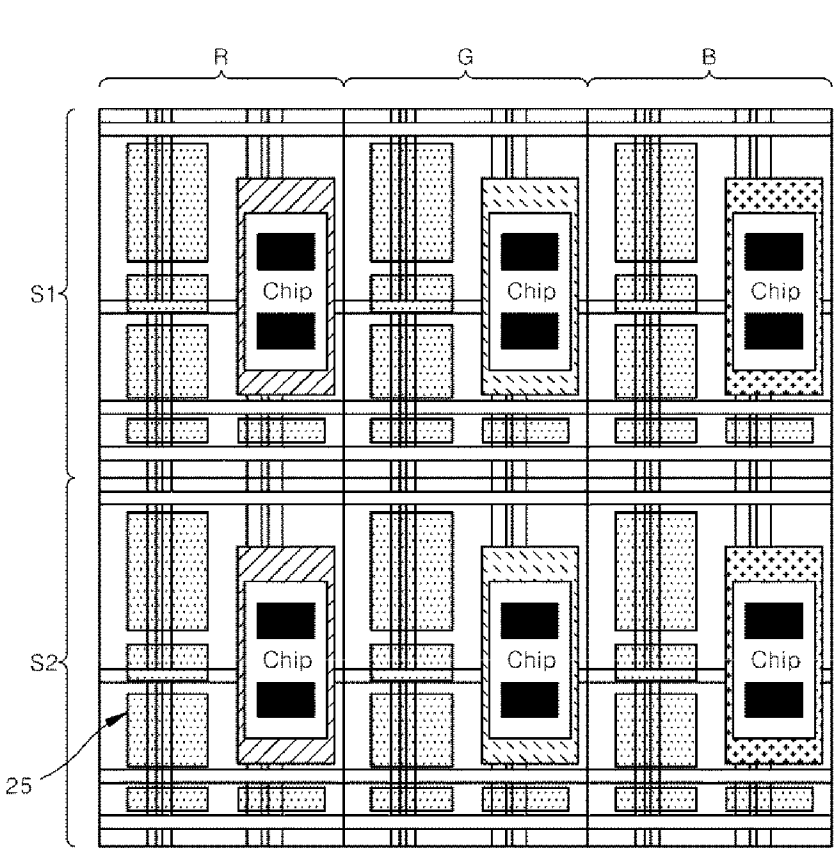

FIG. 2 shows comparison between a case where a driving circuit is placed in each redundancy structure and a case where a single driving circuit is arranged in a single pixel according to an embodiment of the present disclosure.

Reference numerals 21 and 22 show respective circuit configurations on the substrate (for example, a glass substrate) to which the light-emitting diodes are transferred. R, G and B refer to regions in which light-emitting diodes for rendering respective colors are arranged respectively. Each of the light-emitting diodes is transferred to an area labeled "chip". In those configurations, two emitting diodes rendering the same color are arranged in regions S1 and S2, respectively in one sub-pixel.

Reference numeral 21 denotes a structure in which a driving circuit 25 is disposed in a region where each light-emitting diode is disposed. Reference numeral 22 denotes a structure in which only one driving circuit 25 is disposed in a region where two light-emitting diodes are arranged. In the configuration of reference numeral 21, only a light emitting diode among two light emitting didoes disposed in the areas S1 and S2 respectively for each of R, G, and B may actually operate. Thus, only one driving circuit 25 disposed in one of the areas S1 and S2 may actually operate.

That is, in the configuration of reference numeral 21, six light emitting diodes are arranged in a pixel by transferring two light emitting diodes to each sub-pixel region corresponding to each of R, G, and B. Thus, six driving circuits 25 are arranged per pixel. However, because this is a configuration of a redundancy structure, only three driving circuits 25 may actually operate.

This causes the increase of the cost due to the inclusion of the actually non-operating driving circuits 25. In addition, this may be a factor for increasing costs of data IC (D-IC) connected to each driving circuit 25. In addition, there is a problem that transmittance is lowered due to the presence of the six driving circuits 25 corresponding to the six LEDs.

In the structure of reference numeral 22 in accordance with an embodiment of the present disclosure, two light-emitting diodes are transferred to each of R, G, and B, that is, each sub-pixel of each R, G, and B in the same manner as the configuration 21. However, in accordance with the present disclosure, only a single driving circuit 25 is disposed in each of R, G, and B, that is, each sub-pixel of each R, G, and B. Thus, total of three driving circuits 25 are arranged in a RGB pixel. In this embodiment, each light-emitting diode and each driving circuit 25 or a power supply may be connected via each e-fuse to each other.

When a non-emission or non-operating light emitting diode is detected, blowing a corresponding e-fuse may disable a connection between a corresponding driving circuit or power source and the non-emission or non-operating LED. Thus, the non-emission or non-operating LED does not work during actual operation. As a result, only one driver circuit 25 is disposed in a single sub-pixel, thereby reducing a cost of the D-IC, and ensuring the level of light transmittance. That is, the transmittance may be ensured by disposing only three driver circuits corresponding to R, G, and B respectively onto one RGB pixel.

Therefore, the present approach may realize a low cost display device via reducing the production process, and may realize a high-transparent micro LED display panel via securing the improved aperture ratio.

Figure 3:
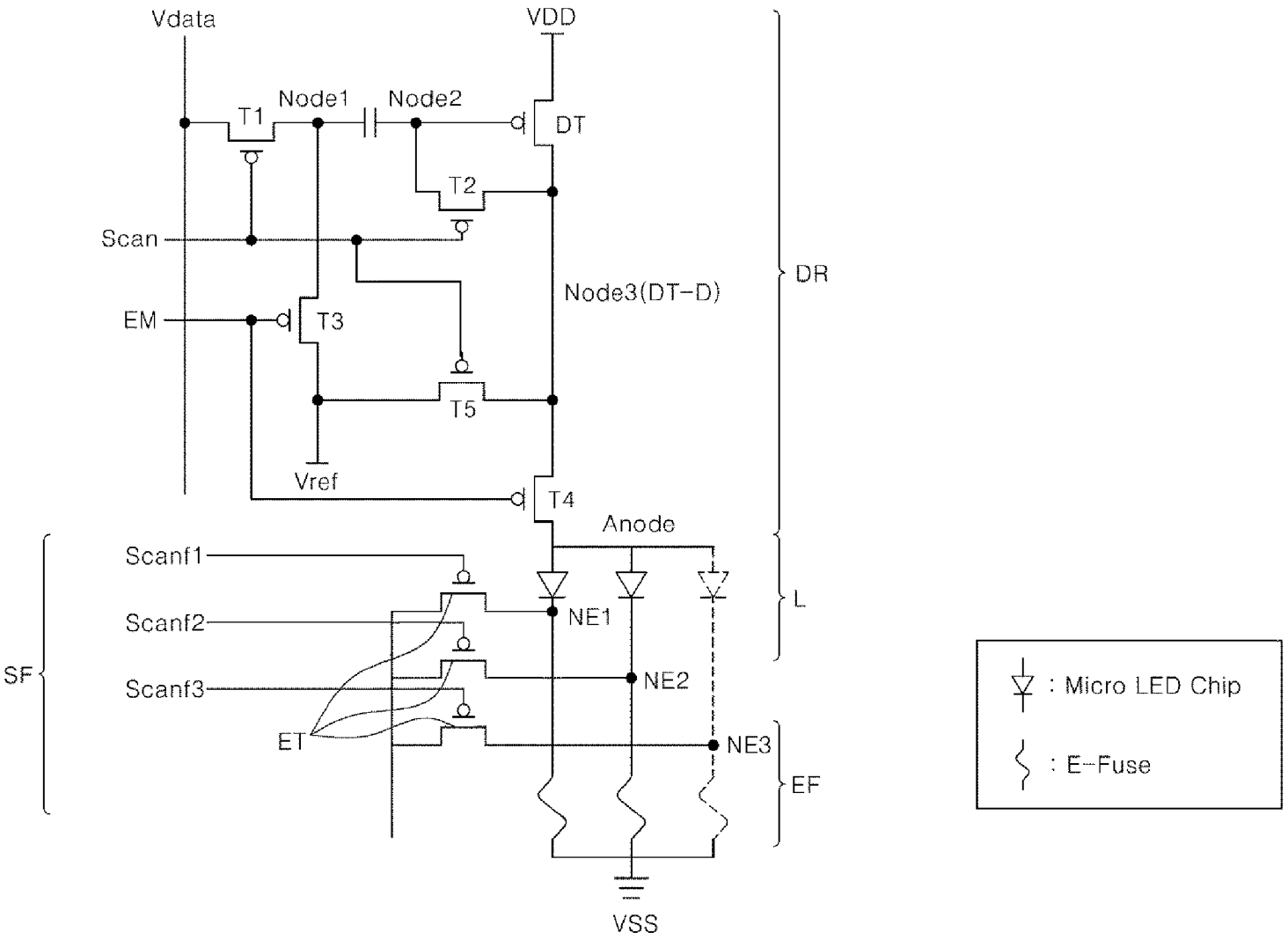
FIG. 3 is a diagram showing a connection structure between a single driving circuit and two or more light-emitting diodes disposed in one sub-pixel according to one embodiment of the present disclosure.

FIG. 3 is a diagram showing a connection structure between a driving circuit and two or more light-emitting diodes disposed in one sub-pixel according to one embodiment of the present disclosure.

One sub-pixel region includes a region where a driving circuit DR is disposed, a region L where two or more light-emitting diodes are disposed, a region (designated as EF) in which an e-fuse EF (Electrical Fuse) is disposed so that only one of two light-emitting diodes is turned on, and a region (indicated by SF) in which a signal to blow the e-fuse is applied. The driving circuit (indicated as DR) may be configured in various ways. The configuration of DR is not limited to the structure of FIG. 3. In some embodiments, the e-fuse is placed in a circuit and acts like a physical fuse.

FIG. 3 shows a configuration of one sub-pixel, in which one sub-pixel includes a driving transistor for driving a light-emitting diode. Subpixels, each being shown in FIG. 3, may be arranged vertically and horizontally in the micro LED display panel. Further, each of a scan signal line SCAN and a light-emission control signal line EM extends in a first direction (e.g., a left-right direction or a horizontal direction in FIG. 3) of the display panel and is connected to each of the sub-pixels.

Further, each of a data line Vdata extends in a second direction of the display panel (e.g., in a vertical direction in FIG. 3) and is connected to each of the sub-pixels. Further, a VDD line extends in the second direction and is connected to each of the sub-pixels.

The region L is contained in a sub-pixel, and two or more light-emitting diodes are arranged in the region L. In an example, in the structure of FIG. 3, three light-emitting diodes may correspond to one driving circuit.

A region as indicated by a dotted line may be a spare space to which a light-emitting diode is transferred. Alternatively, three light-emitting diodes may be placed at the same time and then only one of the three light-emitting diodes may actually work. In one example, a configuration in which two light-emitting diodes are placed instead of the three diodes in FIG. 3 may be considered, which will be described later.

However, since only one of the plurality of light-emitting diodes actually works, selection of the light-emitting diode that actually work may be achieved via the e-fuse. For example, each e-fuse may be connected to each light-emitting diode in an element region. In FIG. 3, three e-fuses corresponding to three light-emitting diodes are placed in the EF region.

Further, other e-fuses blow except for the e-fuse connected to the light-emitting diode selected to actually operate in the display panel. FIG. 3 shows a non-blown state. First, light-emitting diodes and driving circuits are placed on the substrate, and then an unnecessary light-emitting diode(s) is selected during the test. Then, the present approach may blow the e-fuse connected to the selected light-emitting diode. As a result, at least one e-fuse blows in one sub-pixel.

Each e-fuse may be connected to an e-fuse transistor to apply a signal for blowing of the e-fuse. FIG. 3 shows a structure in which each of drain nodes of three e-fuse transistors ET is connected to one end of a corresponding e-fuse (or the other end of a corresponding light-emitting diode NE1, NE2 or NE3).

A source node of the e-fuse transistor ET is connected to a signal line Vf1 in which a signal for blowing the e-fuse flows. A gate node of each e-fuse transistor ET is connected to a corresponding e-fuse scan signal line Scanf1, Scanf2 or Scanf3. In this connection, the e-fuse scan signal line may extend in the first direction.

In this connection, the signal line Vf1 connected to the source node of the e-fuse transistor ET may extend in the second direction. Alternatively, the source node of the e-fuse transistor ET is connected to a data line Vdata in which also the signal for blowing the e-fuse may flow. So, the data line Vdata may be used to provide data to the sub-pixel and also the signal for blowing the e-fuse. In this alternative structure, the number of lines in a display panel are reduced. This will be illustrated in FIG. 4.

Further, to reduce the number of the signal lines, gate nodes of some e-fuse transistors ET may be connected to scan signal lines SCAN or light-emission control signal lines EM respectively. That is, each gate node of the e-fuse transistor ET may be selectively connected to one of a scan signal line SCAN, a light-emission control signal line EM, and an e-fuse scan signal line. This will be discussed in more detail in FIG. 4.

In order for only one of these three light-emitting diodes NE1, NE2, NE3 to operate normally in the display panel, the other light-emitting diodes may be disconnected to the VSS. For example, a control signal may be applied to two of Scanf1, Scanf2, and Scanf3 to allow two e-fuses connected to the VSS to blow. This blowing results in an electrical isolation of the two other light-emitting diodes respectively that are determined not to work and thus to be selected as unnecessary.

In an embodiment, the control signal may be applied to both of Scanf2 and Scanf3. In this case, a low signal may be applied to e-fuse scan signal lines Scanf2 and Scanf3. Thus, the signal is applied to gate nodes of two of the three e-fuse transistors in FIG. 3. As a result, a high current or high voltage applied to Vf1 is applied to one end NE2 and NE3 of the two e-fuses.

That is, when the high current or high voltage is applied to Vf1 so that the e-fuse blows and the low signal is applied to the Scanf2 and Scanf3, the high current or high voltage is applied to NE2 and NE3, and, as a result, the two e-fuses (the e-fuse connected to NE2 and the e-fuse connected to NE3) blow in the EF region. As a result, only one light-emitting diode (the light-emitting diode connected to NE1) operates normally.

When the structure of FIG. 3 is applied, the redundancy of the light-emitting diodes may be available using only one driving circuit. Since only one light-emitting diode is connected to the VSS, the driving circuit may drive one light-emitting diode regardless of which light-emitting diode among the three diodes is the one light-emitting diode.

Further, since only one driving circuit is disposed in a single sub-pixel, an aperture area is increased and thus the transmittance is increased. In particular, since only one driving circuit is disposed per sub-pixel, only one D-IC is disposed per sub-pixel. In this manner, a structure of the D-IC may be same as that in a display panel which does not adopt the redundancy structure. This may simplify a configuration and implementation of the D-IC.

Figure 4:
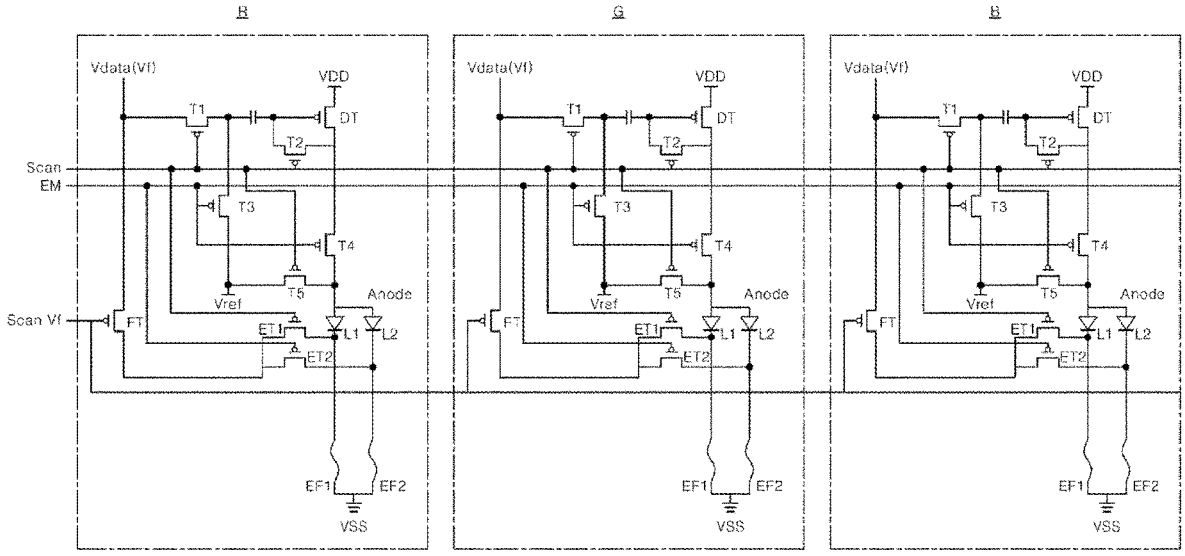
FIG. 4 shows an arrangement of two light-emitting diodes in an element region.

FIG. 4 shows a configuration for selectively removing an e-fuse by adding one signal line in a scan direction according to one embodiment of the present disclosure. In the above-described structure of FIG. 3, the signals in the SF region and Vf1 are connected to wires of an existing driving circuit to reduce the complexity of the circuit configuration.

FIG. 4 shows an arrangement of two light-emitting diodes in an element region. R/G/B sub-pixels have the same structure. Thus, a description of the R sub-pixel will be made by way of example.

An e-fuse control signal line ScanVf (also referred to as Scanf) extends in a scan direction on each of the sub-pixels (R, G, B) constituting a single pixel. Each sub-pixel has two light-emitting diodes forming a redundancy structure. Each light-emitting diode is connected to an e-fuse.

In each sub-pixel of FIG. 4, a light-emitting diode located on a left side is called a first light-emitting diode L1 and a right-positioned light-emitting diode is referred to as a second light-emitting diode L2.

The first light-emitting diode L1 is electrically connected to a first e-fuse transistor ET1 and a first e-fuse EF1. The second light-emitting diode L2 is electrically connected to a second e-fuse transistor ET2 and a second e-fuse EF2.

Further, a gate node of the first e-fuse transistor ET1 is electrically connected to a scan signal line SCAN. The gate node of the second e-fuse transistor ET2 is electrically connected to a light-emission control signal line EM.

In this embodiment, a fusing transistor FT is disposed in each sub-pixel. The e-fuse control signal line ScanVf extending in the first direction is connected to a gate node of the fusing transistor FT. Further, a source node of the fusing transistor FT is connected to the data line Vdata. A drain node of the fusing transistor FT is connected to a source node of each of the first and second e-fuse transistors ET1 and ET2 so that the e-fuse may be removed using the data line.

Further, the data line Vdata disposed in each sub-pixel receives a voltage or current enough to remove the e-fuse ET1 or ET2 in a fusing duration (fusing time or fusing period) in which the e-fuse ET1 or ET2 blows. So, the data line VData is also configured to carry a signal for blowing the e-fuse ET1 or ET2 in order to permanently switch the e-fuse ET1 or ET2 into a blown-state. Further, the light-emission control signal line EM and the scan signal line SCAN may apply a selection signal to each of the first and second transistors so as to electrically-isolate one of the two light-emitting diodes in the fusing duration.

The configuration of FIG. 4 reduces or otherwise minimizes the number of the signal lines needed to remove the e-fuse ET1 or ET2 to electrically-isolate one of the two light-emitting diodes L1 or L2 in each sub-pixel, thereby improving the transparency of the panel.

The number of unused signal lines except for the fusing duration may be reduced or minimized. Further, the signal used in the fusing duration may be applied through a signal line of the driving circuit. Thus, the wiring complexity of the panel may be reduced.

After testing the sub-pixels as shown in FIG. 4, the present approach may detect light-emitting diodes that are faulty or light-emitting diodes that are not needed. When all light-emitting diodes within one sub-pixel work normally, an e-fuse of any one light-emitting diode may blow and thus the corresponding diode may be electrically-isolated. This process will be discussed in more detail.

Figure 5:
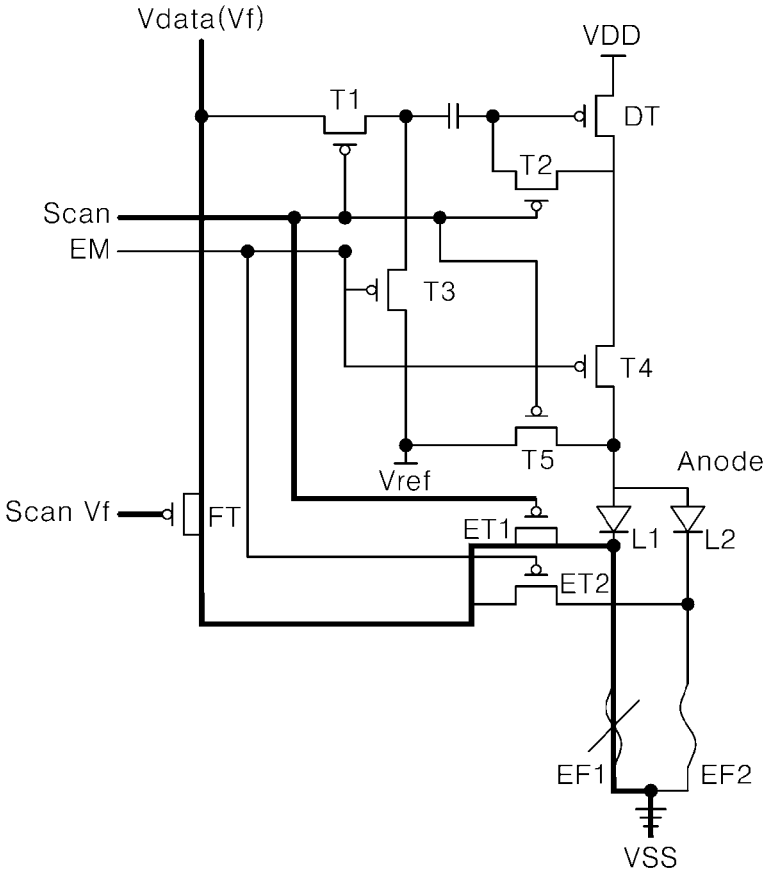
FIG. 5 shows electrical-isolation of a first light-emitting diode among two light-emitting diodes according to one embodiment of the present disclosure.
Figure 5:
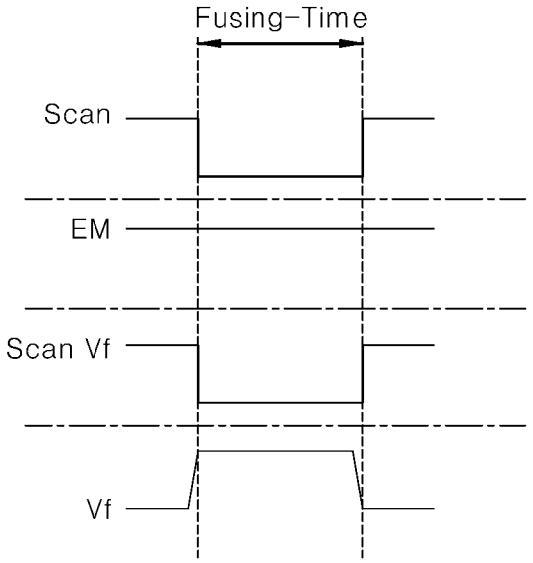

FIG. 5 shows electrical-isolation of a first light-emitting diode among two light-emitting diodes according to one embodiment of the present disclosure. Reference numeral 51 denotes a wiring line to which a signal is applied to electrically-isolate a first light-emitting diode L1. Reference numeral 52 refers to a timing diagram in which a signal is applied to each signal wiring in the fusing duration.

The Vdata line for applying the data signal to the sub-pixel receives Vf required to fuse the first e-fuse EF1 connected to the first light-emitting diode L1. Vf refers to a signal with current or voltage enough to fuse or remove the first e-fuse EF1.

Further, a signal (low signal) is applied to the e-fuse control signal (ScanVf) and the scan signal line SCAN so that Vf may be applied to the first e-fuse EF1 connected to the first light emission diode L1. As a result, Vf is applied to the first e-fuse EF1 connected to the first light-emission diode element L1, so that the first e-fuse EF1 fuses. Thus, the first light-emitting diode L1 is disconnected from a low-potential driving voltage VSS and thus is electrically-isolated.

Figure 6:
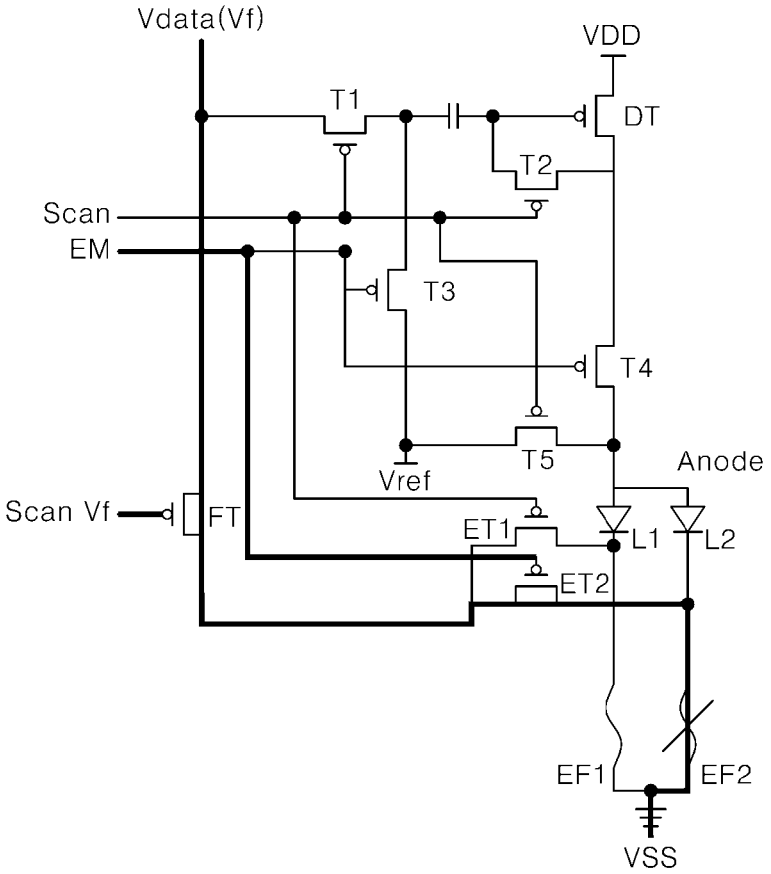
FIG. 6 shows electrical-isolation of a second light-emitting diode among two light-emitting diodes according to one embodiment of the present disclosure.
Figure 6:
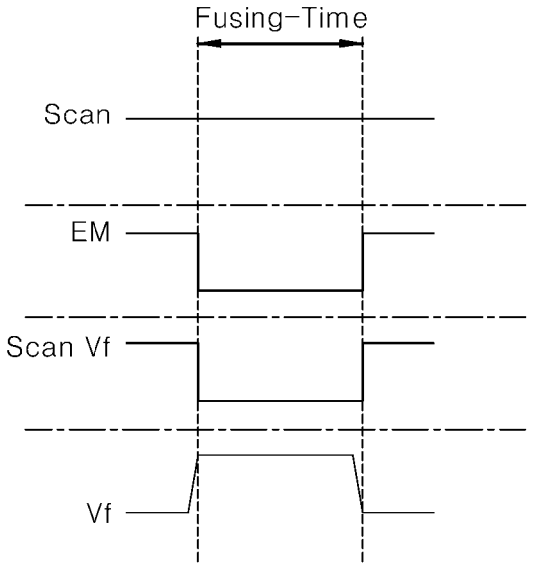

FIG. 6 shows electrical-isolation of a second light-emitting diode among two light-emitting diodes according to one embodiment of the present disclosure. Reference numeral 61 refers to a wiring to which a signal is applied to electrically-isolate the second light-emitting diode L2. Reference numeral 62 refers to a timing diagram in which a signal is applied to each signal wiring in the fusing duration.

The Vdata line for applying the data signal to the sub-pixel may receive Vf necessary for removing the second e-fuse EF2 connected to the second light-emitting diode L2. Vf refers to a signal having a current or voltage enough to remove the second e-fuse EF2.

Further, a signal (low signal) is applied to the e-fuse control signal ScanVf and the light-emission control signal line EM so that Vf may be applied to the second e-fuse EF2 connected to the second light-emission diode L2. As a result, Vf is applied to the second e-fuse EF2 connected to the second light-emission diode L2, such that the second light-emitting diode L2 is disconnected from the low-potential driving voltage VSS and thus is electrically-isolated.

In the process of FIG. 5 or FIG. 6, one of the two e-fuses EF1 and EF2 placed in a sub-pixel with two light-emitting diodes forming a redundancy configuration blows. Then, in the sub-pixel, the light-emitting diode connected to the non-blowing e-fuse performs a normal light-emission operation.

FIG. 7 shows a configuration of an e-fuse according to one embodiment of the present disclosure. An e-fuse that does not blow in the above-described fusing duration acts as a wiring to allow a light-emitting diode to operate. For this purpose, an e-fuse 90 may be constructed to have a smaller width W1 in some portions thereof as shown in FIG. 7.

In FIG. 7, an e-fuse 90 has three portions 91, 92 and 95 but is not limited thereto. The e-fuse 90 that blows contains a region with a narrow width W1. In a blown e-fuse, the narrow width portion blows. That is, the e-fuse 90 blows at the narrow width portion. Thereby, the portions 91 and 92 are electrically-isolated. Narrow width here means that the width W1 is smaller than the width W2 or the width W3. According to an embodiment of the disclosure, only a portion 95 may form an e-fuse 90. In another embodiment, an entire portion 90, e.g., all portions 91, 95 and 92, may form an e-fuse.

When the e-fuse 90 is divided into three portions, the e-fuse 90 may be composed of a portion 91 connected to a light-emitting diode, a portion 92 connected to VSS, and a fused portion 95 between the two portions 91 and 92. Further, a width W1 of the fused portion 95, being a narrow width portion, and widths W2 and W3 of the portions 91 and 92 may satisfy a following relationship:

$$W1<W2$$

$$W1<W3 \qquad \text{[Equation 1]}$$

The fused portion, e.g., the narrow width portion with width W1, may blow away in the fusing duration. Accordingly, when a general driving signal, for example, a data signal is applied to the fused portion, the fused portion does not blow and acts as a wire. However, the fused portion may blow away in the fusing duration. To this end, the width W1 of the fused portion 95 may be smaller than the width W2 of the portion 91 connected to the light-emitting diode.

Similarly, the width W1 of the fused portion 95 may be smaller than the width W3 of the portion 92 connected to VSS. In order that when a general driving signal, for example, a data signal is applied to the fused portion, the fused portion does not blow and acts as a wire, whereas the fused portion blows away in the fusing duration, the e-fuse including the fused portion may be made of at least one selected from a group consisting of Cu, Al, W, PtSi, $TiSi_2$, $WSi_2$, $CoSi_2$, NiSi, $Ti_{30}W_{70}$, and Polysilicon (heavily doped). The e-fuse with the configuration shown in FIG. 7 may be applicable to FIG. 8, FIG. 9, and FIG. 10.

Figure 8:
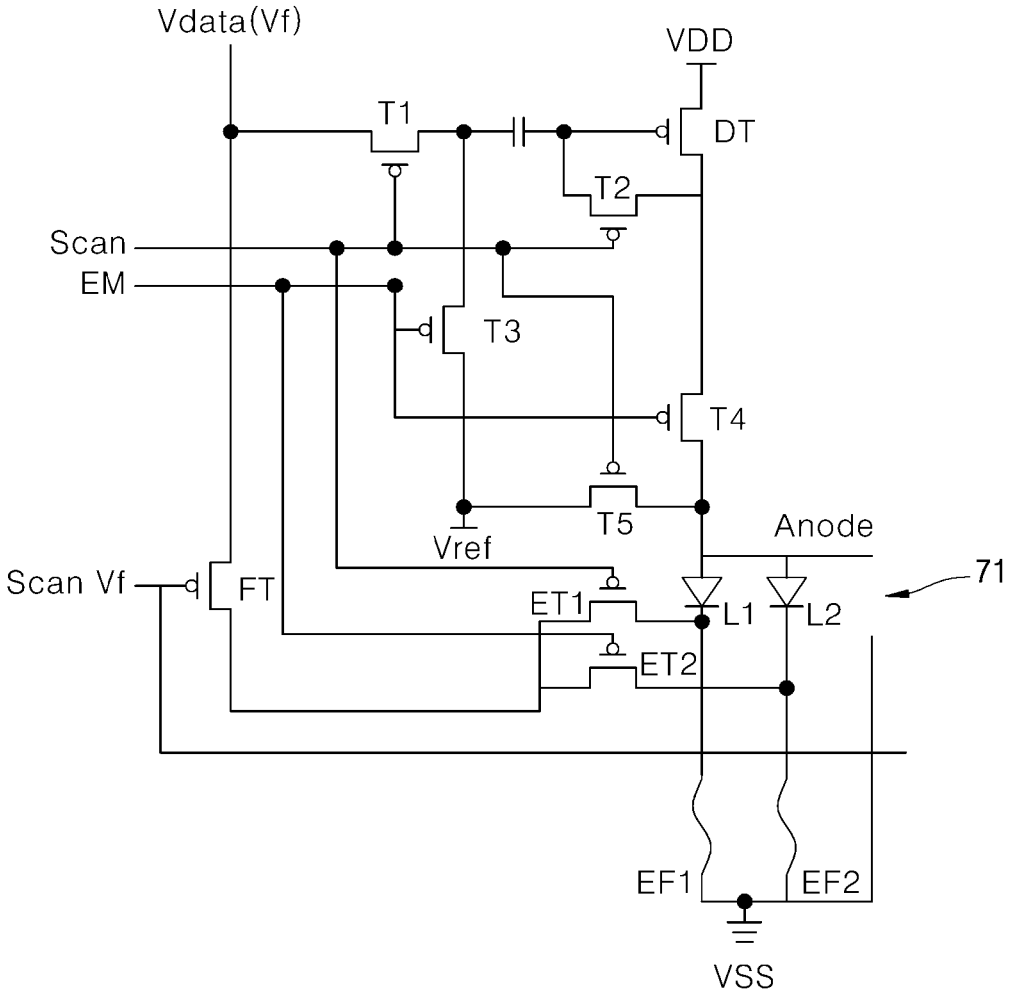
FIG. 8 and FIG. 9 show configurations of a sub-pixel composed of two e-fuses and a spare region according to another embodiment of the present disclosure.
Figure 9:
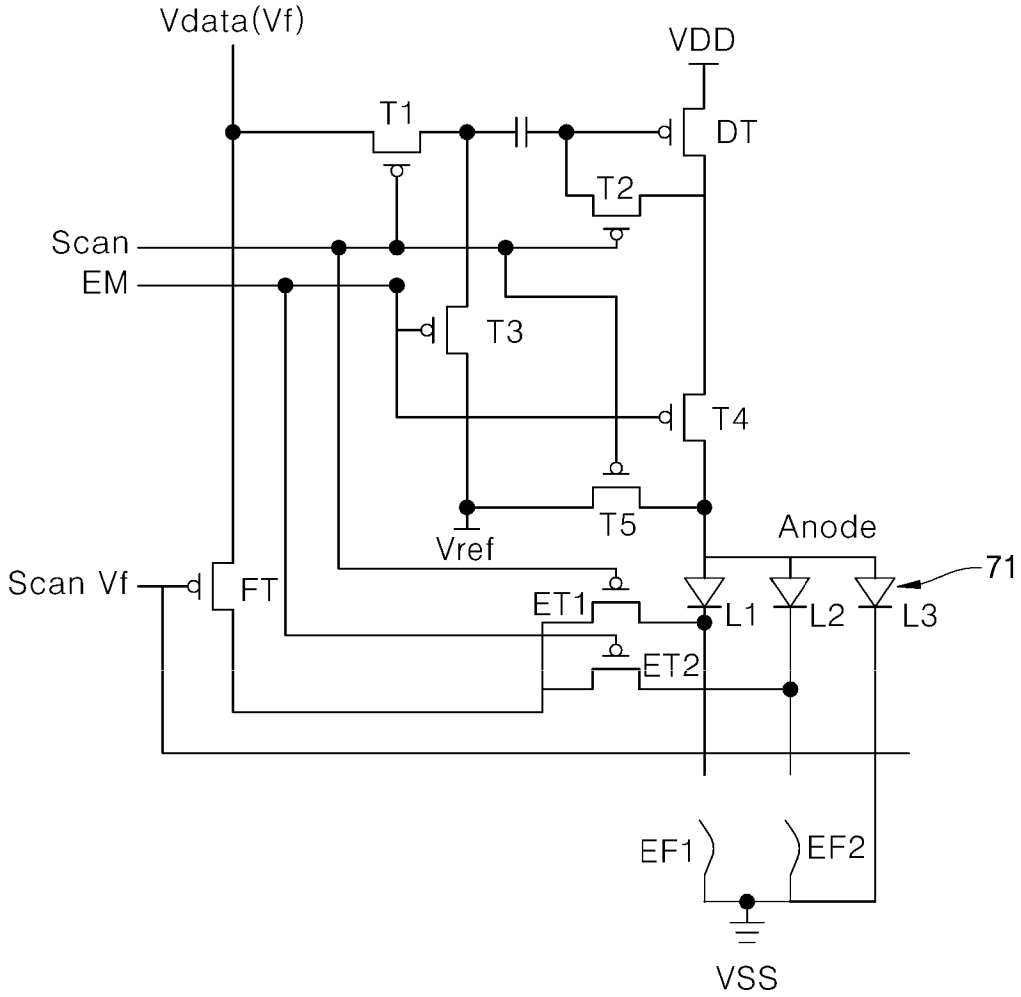

FIG. 8 and FIG. 9 show configurations of a sub-pixel composed of two e-fuses and a spare region according to another embodiment of the present disclosure. A configuration in FIG. 8 except that the sub-pixel is composed of two e-fuses and a spare region is the same as in FIG. 4. Thus, in FIG. 8 and FIG. 9, the sub-pixel includes a driving transistor for driving a light-emitting diode. Scan signal lines SCAN and light-emission control signal lines EM extend in the first direction of the display panel, and are connected to each of the sub-pixels.

Further, each sub-pixel includes an element region in which more than two light-emitting diodes may be arranged. In FIG. 8, two light-emitting diodes L1 and L2 are placed in the element region. One additional light-emitting diode may be placed in the configuration of FIG. 8. Thus, a total of three light-emitting diodes may be placed in the element region. This additional light-emitting diode may be disposed in a spare region 71. In this connection, the additional light-emitting diode is not yet disposed in the spare region 71. In FIG. 9, the additional single light-emitting diode as labeled L3 is placed in the spare region 71.

Further, the two light-emitting diodes L1 and L2 are connected to the e-fuses EF1 and EF2 respectively. The configuration of the e-fuse may be substantially the same as the configuration in FIG. 7 above. When one of the two light-emitting diodes L1 and L2 is in a normal operation, the e-fuse EF1 or EF2 connected to the other light-emitting diode blows. This has been illustrated with reference to FIG. 4 to FIG. 6.

The first light-emitting diode L1 is electrically connected to the first e-fuse transistor ET1 and the first e-fuse EF1. The second light-emitting diode L2 is electrically connected to the second e-fuse transistor ET2 and the second e-fuse EF2.

Further, a gate node of the first e-fuse transistor ET1 is electrically connected to the scan signal line SCAN. A gate node of the second e-fuse transistor ET2 is electrically connected to the light-emission control signal line EM.

The e-fuse transistors ET1 and ET2 are connected to the e-fuses EF1 and EF2, respectively. The structure of the wires for connecting the e-fuse transistors ET1 and ET2 and e-fuses EF1 and EF2, the distribution of the e-fuse control signal ScanVf, and the process for the blowing of the e-fuse are the same as those shown in FIG. 4, FIG. 5 and FIG. 6. In an alternative, when four light-emitting diodes are arranged in a single sub pixel and one light-emitting diode is placed in the spare region, the e-fuse scan signal line may extend in the first direction.

Further, a source node of the e-fuse transistor is connected to the signal line extending in the second direction. In FIG. 8 and FIG. 9, the source node of the e-fuse transistor is connected to the data line Vdata.

In one example, when both of the light-emitting diodes L1 and L2 fail to operate normally, all the e-fuses EF1 and EF2 connected to them blow. Then, a new light-emitting diode L3 may be disposed in the spare region 71.

When the two light-emitting diodes L1 and L2 arranged in FIG. 8 are defective and thus both e-fuses EF1 and EF2 blow, a new light-emitting diode may be disposed in the spare region 71. In other words, the spare region 71 may be reserved to cope with the situation where the two light-emitting diodes L1 and L2 arranged in FIG. 8 are defective and thus both e-fuses EF1 and EF2 blow. Therefore, when any one of the two light-emitting diodes shown in FIG. 8 is driven normally, no spare light-emitting diode is disposed in the spare region 71.

Otherwise, when neither of the two light-emitting diodes in FIG. 8 work, the separate light-emitting diode is placed in the spare region 71, as shown in FIG. 9. Referring to FIG. 9, all e-fuses blow. Further, the new light-emitting diode is disposed in the spare region 71.

No light-emitting diode is transferred to the spare region 71 in a first transfer process. Then, light-emitting diodes are selectively arranged in only some areas of the sub-pixel in a second transfer process. Thus, a configuration in which a separate e-fuse is not disposed may be adopted.

In summary, when one of the two light-emitting diodes is operating normally in the configuration of FIG. 8, one of the e-fuses EF1 and EF2 blows via the process of FIG. 5 or FIG. 6.

FIG. 9 shows a configuration in which that when the two light-emitting diodes L1 and L2 do not work, an additional light-emitting diode is placed in the spare region 71.

The first e-fuse EF1 that was connected to the first light-emitting diode L1 is in a blown state. Likewise, the second e-fuse EF2 which was connected to the second light-emitting diode L2 also blows.

Then, the spare region 71 receives a third light-emitting diode L3. The third light-emitting diode L3 is selectively placed. Thus, the third diode L3 may be connected directly to the VSS without needing to be connected to a separate e-fuse.

Figure 10:
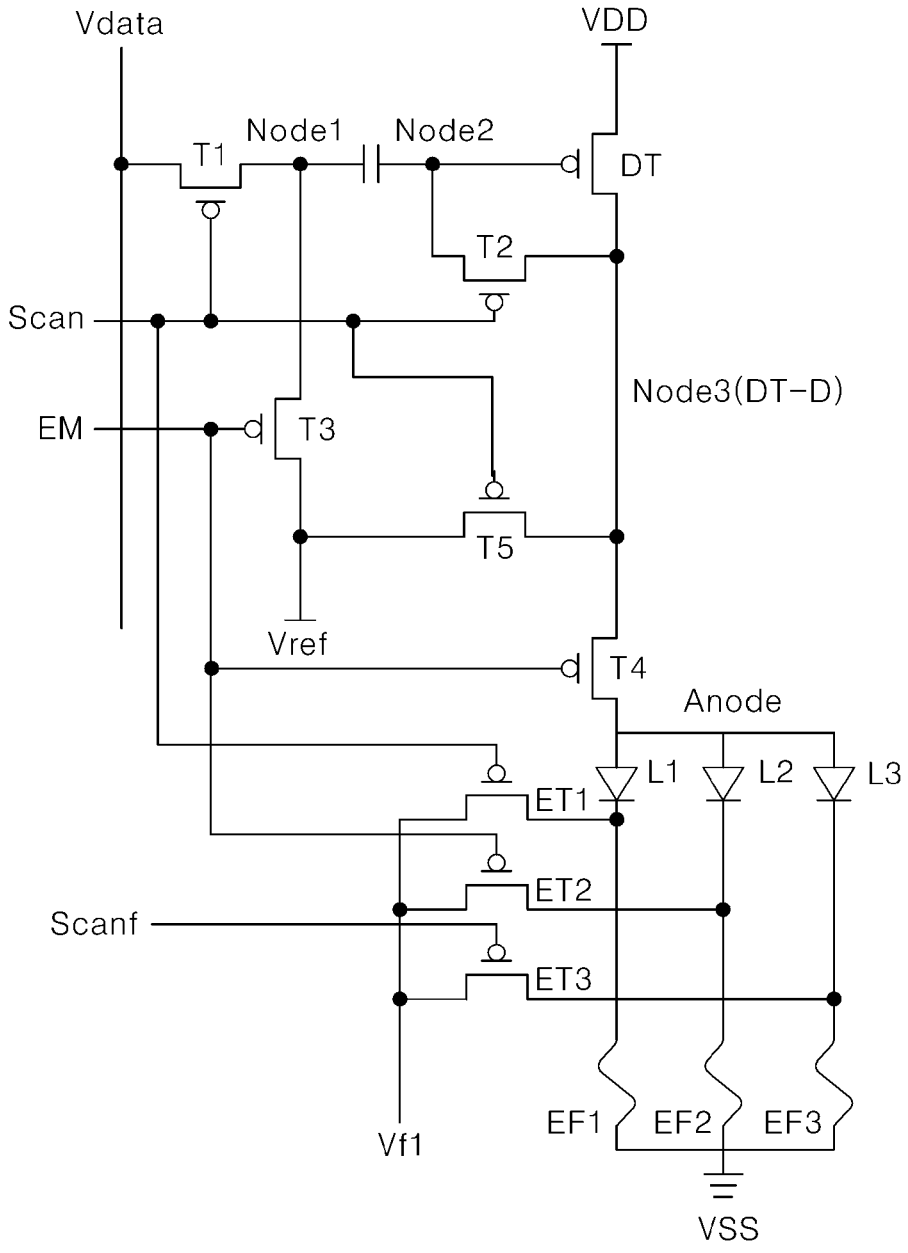
FIG. 10 shows a configuration of a sub-pixel composed of three e-fuses and three light emitting diodes according to still another embodiment of the present disclosure.

FIG. 10 shows a configuration of a sub-pixel composed of three e-fuses and three light-emission diodes according to another embodiment of the present disclosure. In a variant of the embodiment of FIG. 3, two e-fuses among three e-fuses are connected to the light-emission control signal line EM and the scan signal line SCAN, respectively, while one e-fuse among the three e-fuses is connected to a separate e-fuse scan signal line Scanf. The overlapping configurations between FIG. 10 and FIG. 3 to FIG. 6 will be omitted.

N (natural number; N) light-emitting diodes are arranged in a single sub-pixel. In this connection, N e-fuses and N e-fuse transistors are connected to these N light-emitting diodes respectively. Some wires connected to the e-fuse transistors are electrically connected to the scan signal line SCAN and the light-emission control signal line EM. Further, the remaining e-fuse transistors are connected to the e-fuse scan signal line Scanf extending in the first direction.

As shown in FIG. 10, the three light-emitting diodes L1, L2, and L3 are connected to three e-fuses EF1, EF2, and EF3, respectively. Further, one end of each of these e-fuses is electrically connected to each of three e-fuse transistors ET1, ET2, and ET3. In summary, the first light-emitting diode L1 is electrically connected to the first e-fuse transistor ET1 and the first e-fuse EF1. The second light-emitting diode L2 is electrically connected to the second e-fuse transistor ET2 and the second e-fuse EF2. The third light-emitting diode L3 is electrically connected to the third e-fuse transistor ET3 and the third e-fuse EF3.

Further, a gate node of the first e-fuse transistor ET1 is electrically connected to the scan signal line SCAN. A gate node of the second e-fuse transistor ET2 is electrically connected to the light-emission control signal line EM. Further, a gate node of the third e-fuse transistor ET3 is electrically connected to the e-fuse scan signal line Scanf.

When applying the e-fuse with the structure shown in FIG. 7 to FIG. 3 to FIG. 6 and FIG. 8 to FIG. 10, a current supply to a specific LED element may be blocked via an e-fuse blowing in a display panel in which light-emitting diodes forming a redundancy structure are arranged in a single sub-pixel. Thus, including only one driving circuit into a single sub-pixel may improve the transmittance of the panel.

Therefore, after manufacturing a display panel (or a display device), monitoring is performed before shipment of the panel to select a light-emitting diode that will not receive current during operation for each sub-pixel. Then, a signal indicating the selected LED and a control signal for blowing the selected LED are programmed into the display panel. Then, the blowing of the e-fuse based on the signals may allow only one of the light-emitting diodes forming the redundancy structure to effectively operate.

FIG. 11 to FIG. 14 show memory information, and configuration of a display panel for e-fuse blowing, and a process of blowing of the e-fuse according to one embodiment of the present disclosure.

FIG. 11 shows a memory structure indicating the light-emitting diode to be electrically-isolated according to one embodiment of the present disclosure.

Information about the light-emitting diode to be electrically-isolated in each of sub-pixels composed of n rows and m columns may be stored in memory. Reference numeral 141 refers to an embodiment in which two light-emission diodes are arranged in one sub-pixel, and one light-emitting diode is to be electrically-isolated per sub-pixel. In another example, when all of the light-emission diodes do not work, the electrical-isolation may not be required. Further, when only one of the two diodes works, the electrical-isolation may not be required.

Reference numeral 142 denotes an embodiment in which three light-emission diodes are arranged in one sub-pixel, and two light-emitting diodes is to be electrically-isolated per sub-pixel. Similarly, in another example, when all of the light-emission diodes do not work, the electrical-isolation may not be required. Further, when only one of the three diodes works, the electrical-isolation may not be required.

Figure 12:
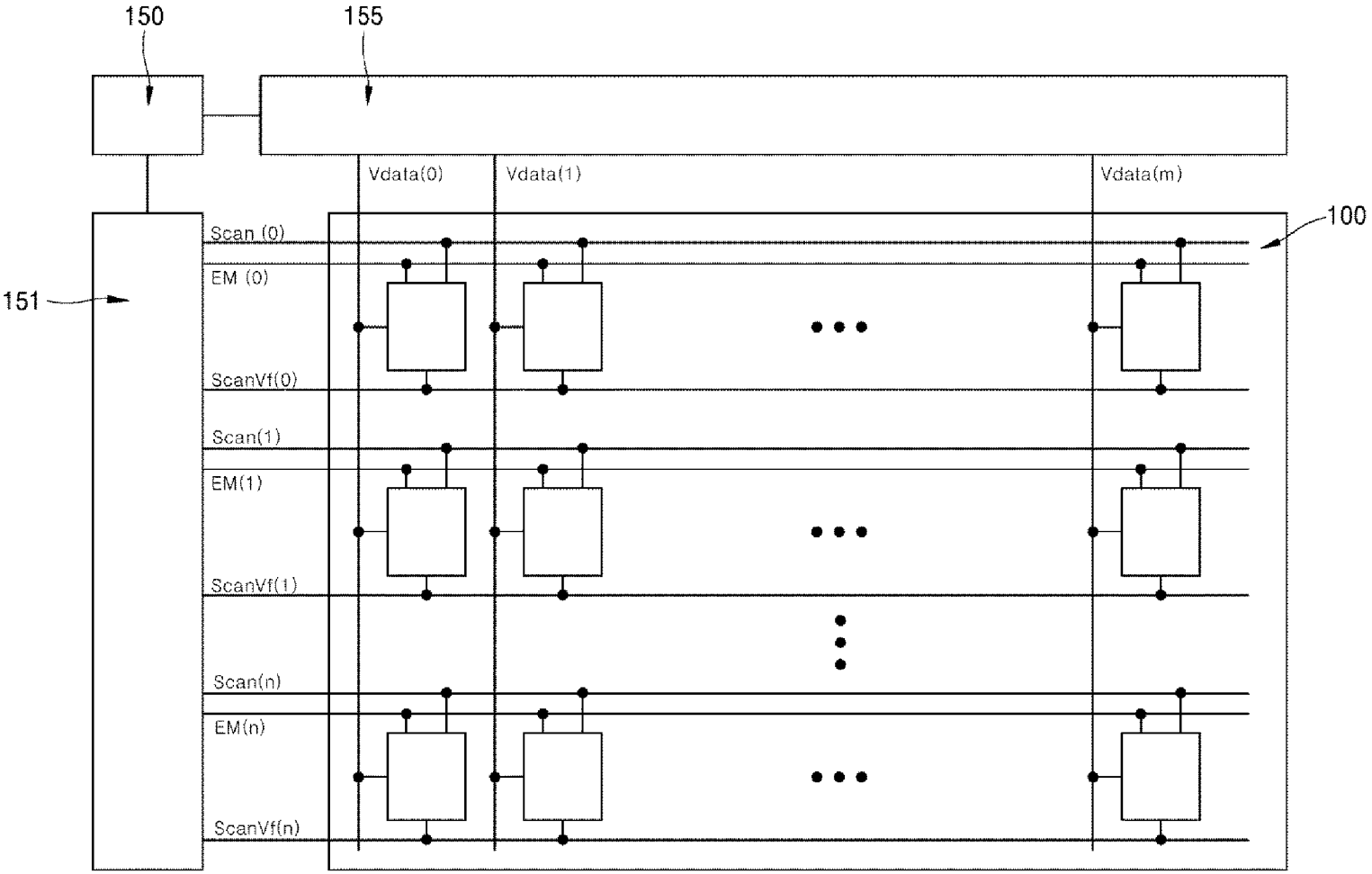
FIGS. 12 and 13 show configurations of a display panel for e-fuse blowing according to one embodiment of the present disclosure.
Figure 13:
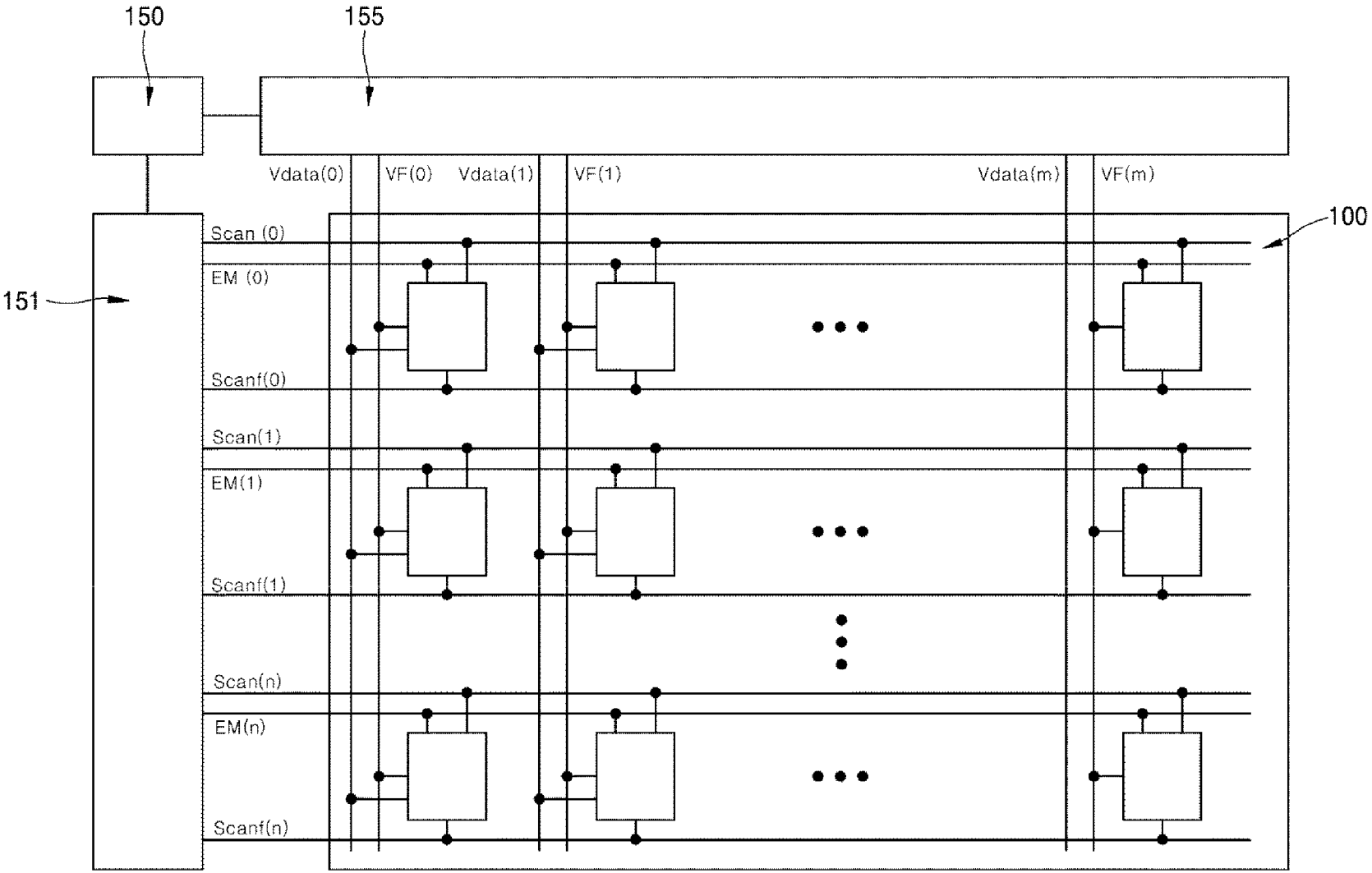

FIG. 12 and FIG. 13 show a display panel with an arrangement of sub-pixels and a structure of wires disposed therein according to one embodiment of the present disclosure. The sub-pixels that are arranged at n rows and m columns, as shown in FIG. 11, are placed in the display panel.

In FIG. 12 and FIG. 13, the display panel includes a timing controller 150, a gate driver 151, and a data driver 155. The timing controller 150 controls the gate driver 151 and the data driver 155 to control the operation of the light-emission diodes in the sub-pixel. Further, the timing controller 150 applies a signal to the gate driver 151 and the data driver 155 to blow an e-fuse connected to a target light-emitting diode to be electrically-isolated. This will be described in details.

FIG. 12 shows a structure in which two light-emission diodes are arranged in one sub-pixel. This structure contains the structure as shown in FIG. 4. Sub-pixels including driving transistors for driving light-emitting diodes are disposed in the display panel 100. Further, scan signal lines Scan(0) to Scan(n) and light-emission control signal lines EM(0) to EM(n) are connected to these sub-pixels respectively and extend in the first direction of the display panel. Further, the data lines Vdata(0) to Vdata(m) extend in the second direction of the display panel, and are connected to the sub-pixels respectively.

Further, a configuration in which two light-emitting diodes are arranged per sub-pixel, and e-fuses are connected to these light-emitting diodes respectively, and e-fuse transistors are connected to the e-fuses respectively is as described above with reference to FIG. 4.

More specifically, the first light-emitting diode in the sub-pixel is electrically coupled to the first e-fuse transistor and the first e-fuse. The second light-emitting diode in the sub-pixel is electrically connected to the second e-fuse transistor and the second e-fuse.

The gate node of the first e-fuse transistor is electrically connected to the scan signal line. The gate node of the second e-fuse transistor is electrically connected to the light-emission control signal line. Further, each sub-pixel has a fusing transistor. The e-fuse control signal lines ScanVf(0) to ScanVf(n) extend in the first direction and are connected to gate node of the fusing transistor.

Further, a source node of the fusing transistor is connected to the data line described above. A drain node of the fusing transistor is connected to the source nodes of the first and second e-fuse transistors.

FIG. 13 shows a structure in which three or more light-emission diodes are arranged in one sub-pixel. This structure includes the structure shown in FIG. 3 or FIG. 10.

As shown in FIG. 3 or FIG. 10, the panel includes sub-pixels, each including a driving transistor for driving a light-emitting diode, and scan signal lines Scan(0) to Scan (n) and light-emission control signal lines EM(0) to EM(n) extending in the first direction of the display panel and connected to the sub-pixels respectively.

Further, the data lines Vdata(0) to Vdata(m) extend in the second direction of the display panel, and are connected to the sub-pixels respectively.

Further, N light-emitting diodes are arranged in a single sub pixel, and N e-fuses are connected to the N light-emitting diodes respectively. N e-fuse transistors are connected to the N e-fuses respectively. These N e-fuse transistors may be controlled to blow the N e-fuses respectively.

For example, a gate node of each e-fuse transistor is connected to one of the scan signal line, the light emission control signal line, and each of the e-fuse scan signal lines extending in the first direction.

Further, all of source nodes of two or more e-fuse transistors are connected to signal lines VF(0) to VF(m) extending in the second direction.

Figure 14:
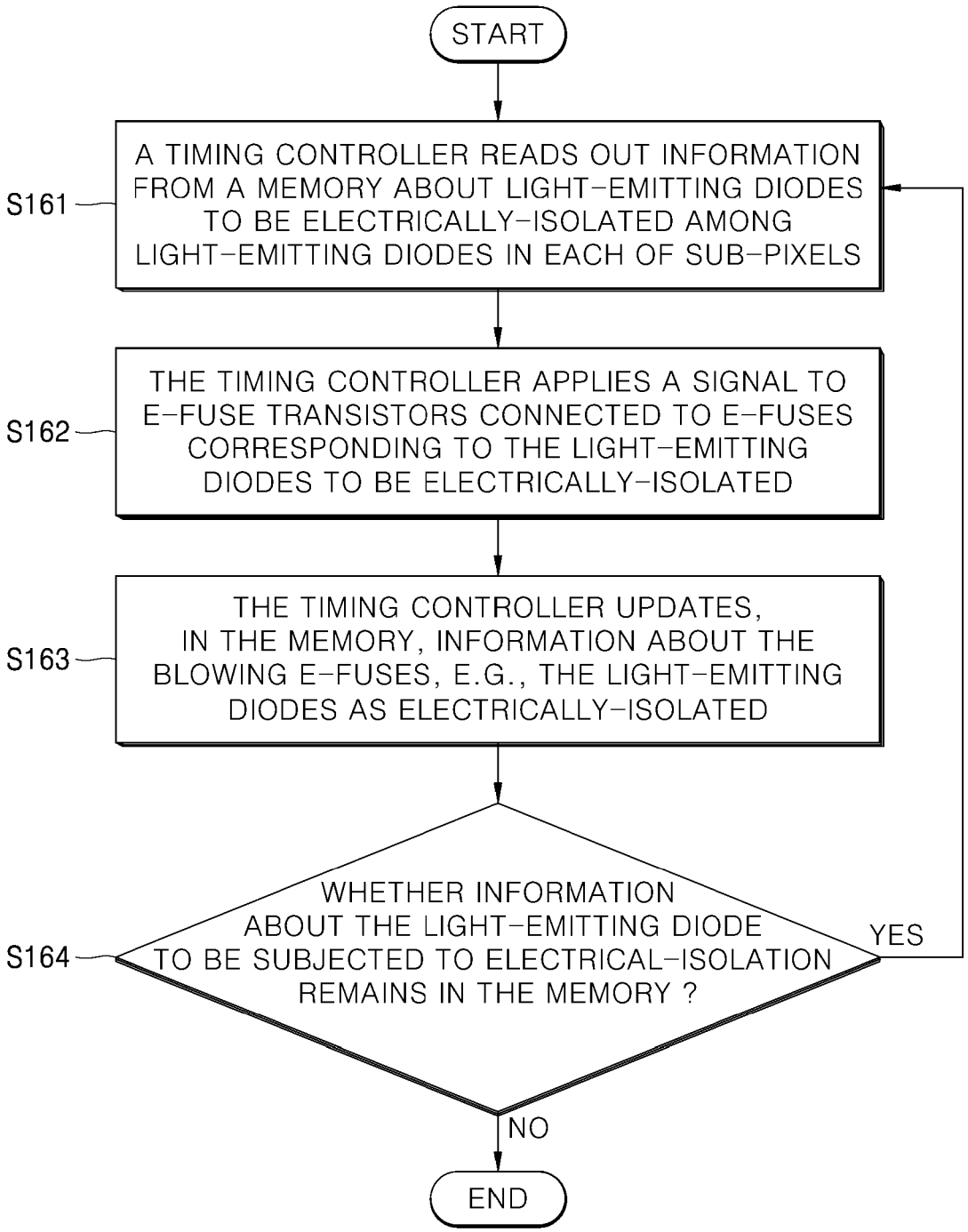
FIG. 14 shows a process of blowing of an e-fuse according to one embodiment of the present disclosure.

FIG. 14 shows a process of electrical-isolation of a light-emitting diode in a configuration as in FIG. 12 or FIG. 13 according to one embodiment of the present disclosure.

First, the timing controller reads out information from the memory about the light-emitting diodes to be electrically-isolated among the N light-emitting diodes in each of sub-pixels S161. In the example of FIG. 12 and FIG. 4, one or zero of two light-emitting diodes may be electrically-isolated per sub-pixel.

In the example of FIG. 13 and FIG. 10, and FIG. 3, the number of light-emitting diodes to be electrically-isolated per sub-pixel may be between N−1 and 0.

Then, the timing controller 150 applies a signal to the e-fuse transistors connected to the e-fuses corresponding to the light-emitting diodes to be electrically-isolated, thereby to fuse the e-fuses S162.

The timing controller 150 then updates, in the memory, information about the blowing e-fuses, e.g., the light-emitting diodes as electrically-isolated. The light-emitting diodes as electrically-isolated may be removed from the memory information of FIG. 11 S163.

Further, it is determined in S164 whether information about the light-emitting diode to be subjected to electrical-isolation remains in the memory, the process proceeds to S161, S162, and S163 when the determination result is positive. When the information about the light-emitting diode to be subjected to electrical-isolation is not present in the memory, that is, when the determination result is negative, the method terminates.

The operation S162 will be described in more detail. Referring to the embodiment of FIG. 11 and FIG. 12, a value of 1 stored in the memory information indicated by the reference numeral 141 indicates electrical-isolation of the first light-emitting diode in the corresponding sub-pixel. A value of 2 indicates electrically-isolating the second light-emitting diode in the corresponding sub-pixel. In this connection, for a sub-pixel having the value of 1 stored in the memory information, a following procedure may be performed.

The timing controller 150 applies a signal for fusing a first e-fuse to a data line to each sub-pixel where a first light-emitting diode to be electrically-isolated is connected to the first e-fuse, and a first scan signal line is connected to the first e-fuse. At the same time, or in a predetermined time interval, the controller 150 applies a signal for turning on a first e-fuse transistor connected to the first e-fuse to the first scan signal line and applies a signal to activate a first fusing transistor to a first e-fuse control signal line. A detailed operation thereof is as described above with reference to FIG. 5.

For a sub-pixel having the value of 2 stored in the memory information, a following procedure may be performed.

The timing controller 150 applies a signal for fusing a second e-fuse to a data line to a sub-pixel where a second light-emitting diode to be electrically-isolated is connected to the second e-fuse, and a first light emission control signal line is connected to the second e-fuse. At the same time, or in a predetermined time interval, the controller 150 applies a signal for turning on a second e-fuse transistor connected to the second e-fuse to the first light emission control signal line and applies a signal to activate a second fusing transistor to a second e-fuse control signal line. A detailed operation thereof is as described above with reference to FIG. 6.

In this connection, the memory information values for the i-th row and the (i+1)-th row may be the same. For example, the first and second rows of the table 141 in FIG. 11 have the same memory values, as indicated by an arrow 143. In this case, applying a scan signal or a light-emission control signal to the sub-pixels corresponding to the first and the second rows simultaneously may allow the light-emitting diodes in the two rows to be electrically-isolated simultaneously.

The operation S162 will be described in more detail referring to the embodiment of FIGS. 11 and 13. Referring to the example of FIG. 11 and FIG. 13, the value of 1 stored in the memory information as indicated by the numeral 142 indicates electrically-isolating the first light-emitting diode in the sub-pixel. A value of 2 indicates electrically-isolating the second light-emitting diode in the corresponding sub-pixel. A value of 3 indicates electrical-isolation of the third light-emitting diode in the sub-pixel. This may be applied to a value of N when the number of total light-emitting diodes per sub-pixel is N.

In this case, the timing controller 150 of FIG. 13 may apply a signal to either a first scan signal line (one of Scan(0) to Scan(n)), a first light-emission control signal line (one of EM(0) to EM(n)), or an e-fuse scan signal line (one of Scanf(0) to Scanf(n)) to turn on the e-fuse transistor connected to the light-emission diode corresponding to the read information.

Then, the controller 150 may apply a signal for fusing an e-fuse connected to the turned-on e-fuse transistor to a signal line (some or all of VF(0) to VF(m)) connected to the source node of the turned-on e-fuse transistor, thereby to fuse the e-fuse.

As shown in FIG. 11 to FIG. 14, when the light-emitting diodes to be electrically-isolated as located in the sub-pixels connected to each scan signal line have the same information value as indicated via the numeral 143, the light-emitting diodes may be simultaneously electrically-isolated.

In one example, the light-emitting diodes to be electrically-isolated in the sub-pixels connected to a first scan signal line may have the same information value as the light-emitting diodes to be electrically-isolated in the sub-pixels connected to a second scan signal line. In this connection, the first and second scan signal lines may not be immediately adjacent to each other. Further, this may be applied between two or more scan signal lines.

In other words, light-emission diodes to be electrically-isolated between the sub-pixels connected to the same data line may have the same information value as indicated by the numeral 143.

In this case, the timing controller 150 may simultaneously electrically-isolate the light-emitting diodes to be electrically-isolated having the same information value between the sub-pixels connected to the first scan signal line and the second scan signal line.

In one example, when most light-emitting diodes are correctly mounted and work, the second or third light-emitting diode may be electrically-isolated. In this case, the timing controller 150 compares the values stored in the memory. When the light-emitting diodes to be electrically-isolated have the same information value between the sub-pixels connected to each scan signal line, the controller may apply a signal to any two or more of the scan signal lines (Scan(0) to Scan(n)) such that the same signal is applied to the sub-pixels connected to the corresponding scan signal line. Similarly, when the light-emitting diodes to be electrically-isolated have the same information value between the sub-pixels connected to each light emission control signal line, the controller may apply a signal to any two or more of the light emission control signal lines (EM(0) to EM(n)) such that the same signal is applied to the sub-pixels connected to the corresponding light emission control signal line. Similarly, when the light-emitting diodes to be electrically-isolated have the same information value between the sub-pixels connected to each e-fuse scan signal line, the controller may apply a signal to any two or more of the e-fuse scan signal lines (Scanf(0) to Scanf(n)) such that the same signal is applied to the sub-pixels connected to the corresponding e-fuse scan signal line.

A material that constitutes the e-fuse may have a characteristic such that when the light-emitting diode is driven, the fuse may not blow, whereas when a high current or voltage is applied thereto, the fuse may blow. The scan signal line, the light-emission control signal line, and the data line may be employed as a line necessary for blowing of the e-fuse. Thus, the data driver IC (D-IC) and the gate driver IC (G-IC) may be used to blow a specific e-fuse in a specific sub-pixel.

Further, the e-fuse may employ the same material as other wires. Thus, the display panel may be manufactured in a simple manner without separately selecting and depositing the e-fuse material. Further, a specific wire modification (e-fuse blowing) may be achieved in a circuit manner in the repair process.

This may remove the redundantly disposed light-emitting diodes via the repair process, to increase the quality of the display panel. Further, a redundancy structure is composed of only a plurality of light-emitting diodes, resulting in improvement of a productivity and a reduction of the production cost.

In particular, in the redundancy structure, the number of transistors or capacitors required for driving circuits per sub-pixel may not increase. This can improve the panel transmission via lowering the complexity of the circuit component such as D-IC and G-IC.

While the foregoing is directed to the embodiments of the present disclosure, various modifications and variations may be made to the skilled person to the art. Accordingly, these changes and modifications may be included in the scope of the present disclosure.

The various embodiments described above can be combined to provide further embodiments. Further changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display panel, comprising:

sub-pixels including driving transistors for driving light-emitting diodes;

scan signal lines and light-emission control signal lines connected to the sub-pixels respectively and extending in a first direction of the display panel;

data lines connected to the sub-pixels respectively and extending in a second direction of the display panel, the second direction being transverse to the first direction;

element regions, wherein [each] *a first* sub-pixel *of the sub-pixel* has [each] *a first* element region [wherein] *of the element regions, the first element region including* at least two light-emitting diodes [are arranged in each element region;] *structured to emit light of a same first color, and one of the at least two light-emitting diodes being electrically connected to emit light of the first color*

[a plurality of e-fuses, wherein at least two e-fuses are arranged in each element region and are connected to the at least two light-emitting diodes respectively, wherein at least one of the at least two e-fuses has blown; and]

[a plurality of e-fuse transistors, wherein at least two e-fuse transistors are connected to the at least two e-fuses respectively,]

[wherein a gate node of each e-fuse transistor is connected to one of the scan signal line or the light-emission control signal line or optionally an e-fuse scan signal line extending in the first direction; and]

[wherein all of source nodes of the two or more e-fuse transistors are connected to a signal line extending in the second direction] ,

*wherein the first element region has a spare region, and wherein the spare region is free of a light-emitting diode.*

2. The display panel of claim 1, *wherein the first element region includes a first driving circuit,* wherein *the at least* two light-emitting diodes are placed in [each] *the first* element region, wherein a first light-emitting diode of the *at least* two light-emitting diodes is electrically connected to [a first e-fuse transistor and a first e-fuse] *the first driving circuit, and* wherein a second light-emitting diode of the *at least* two light-emitting diodes is electrically [connected to a second e-fuse transistor and a second e-fuse,] *disconnected from the first driving circuit*

[wherein a gate node of the first e-fuse transistor is electrically connected to the scan signal line, and]

[wherein a gate node of the second e-fuse transistor is electrically connected to the light-emission control signal line].

[3. The display panel of claim 2, wherein a fusing transistor is placed in each sub-pixel, wherein an e-fuse control signal line extends in the first direction that is connected to a gate node of the fusing transistor, wherein a source node of the fusing transistor is connected to the data line, and wherein a drain node of the fusing transistor is connected to source nodes of the first and second e-fuse transistors.]

[4. The display panel of claim 2, wherein either the first e-fuse or the second e-fuse is blown.]

[5. The display panel of claim 1, wherein a non-blowing e-fuse contains a first portion of the e-fuse having a narrower width than a second portion adjacent to the first portion.]

[6. The display panel of claim 1, wherein each element region has a spare region in which one light-emitting diode is to be disposed.]

[7. The display panel of claim 6, wherein the spare region is currently free of a light-emitting diode, wherein either the first e-fuse or the second e-fuse has blown.]

[8. The display panel of claim 7, wherein a fusing transistor is placed in each sub-pixel, wherein an e-fuse control signal line extending in the first direction is connected to a gate node of the fusing transistor, wherein a source node of the fusing transistor is connected to the data line, and wherein a drain node of the fusing transistor is connected to source nodes of the first and second e-fuse transistors.]

[9. The display panel of claim 6, wherein two light-emitting diodes is placed in each element region, wherein the two light-emitting diodes includes first and second light-emitting diodes, wherein both of a first e-fuse connected to the first light-emitting diode and a second e-fuse connected to the second light-emitting diode have blown, wherein a light-emitting diode is disposed in the spare region.]

[10. The display panel of claim 6, wherein a non-blowing e-fuse contains a first portion of the e-fuse having a narrower dimension than a second portion adjacent to the first portion.]

[11. A display panel, comprising:

sub-pixels including driving transistors for driving light-emitting diodes;

scan signal lines and light-emission control signal lines connected to the sub-pixels respectively and extending in a first direction of the display panel;

data lines connected to the sub-pixels respectively and extending in a second direction of the display panel, the second direction being transverse to the first direction;

element regions, wherein each sub-pixel has each element region, wherein N light-emitting diodes are arranged in each element region;

a plurality of e-fuses, wherein N e-fuses are arranged in each element region and are connected to the N light-emitting diodes respectively, wherein N−1 of the e-fuses have blown; and a plurality of e-fuse transistors, wherein N e-fuse transistors are connected to the N e-fuses respectively, wherein a gate node of each e-fuse transistor is connected to one of the scan signal line or the light-emission control signal line or optionally an e-fuse scan signal line extending in the first direction;

wherein all of source nodes of the two or more e-fuse transistors are connected to the a signal line extending in the second direction; and wherein N is a natural number greater than 1.]

[12. The display panel of claim 11, wherein N is three, wherein the three light-emitting diodes include first, second, and third light-emitting diodes, wherein the first light-emitting diode is electrically connected to a first e-fuse transistor and a first e-fuse, wherein the second light-emitting diode is electrically connected to a second e-fuse transistor and a second e-fuse, wherein the third light-emitting diode is electrically connected to a third e-fuse transistor and a third e-fuse, wherein a gate node of the first e-fuse transistor is electrically connected to the scan signal line, wherein a gate node of the second e-fuse transistor is electrically connected to the light-emission control signal line, and wherein a gate node of the third e-fuse transistor is electrically connected to the e-fuse scan signal line.]

[13. The display panel of claim 11, wherein a non-blowing e-fuse contains a first portion of the e-fuse that has narrower dimension than a second portion adjacent to the first portion.]

[14. A method for electrically-isolating a light-emitting diode in a display panel, the method comprising:

reading, by a timing controller, a readout information about a light-emitting diode to be electrically-isolated among a plurality of light-emitting diodes in each sub-pixel;

applying, by the timing controller, a signal to either a first scan signal line, a first light-emission control signal line, or an e-fuse scan signal line based on the readout information to turn on an e-fuse transistor corresponding to the light-emission diode to be electrically-isolated; and applying, by the timing controller, a signal for blowing an e-fuse connected to the e-fuse transistor to a signal line connected to a source node of the e-fuse transistor, thereby to blow the e-fuse.]

[15. The method of claim 14, wherein the method further comprises:

when a first group of light-emitting diodes to be electrically-isolated in sub-pixels connected to the first scan signal line, and a second group of light-emitting diodes to be electrically-isolated in sub-pixels connected to a second scan signal line are disposed in sub-pixels connected to a same data line, simultaneously electrically-isolating, by the timing controller, the first and second groups of light-emitting diodes.]

*16. The display panel of claim 1, wherein a second sub-pixel of the sub-pixels has a second element region of the element regions, the second element region including at least two light-emitting diodes, and each of the at least two light-emitting diodes of the second element region being connected to emit light of a same second color.*

*17. A display panel, comprising:*

*a subpixel including:*

*a first region including a first light-emitting element;*

*a second region adjacent to the first region within the same subpixel, the second region including a second light-emitting element;*

*a driving circuit configured to drive at least one of the first light-emitting element and the second light-emitting element,*

*wherein the first light-emitting element and the second light-emitting element are each configured to emit light of a same color,*

*wherein the first region has a spare region, and wherein the spare region is free of a light-emitting diode.*

*18. The display panel of claim 17,*

*wherein the first light-emitting element and the second light-emitting element are both micro LED chips or both OLEDs.*

*19. The display panel of claim 17,*

*wherein the first light-emitting element and the second light-emitting element are connected in parallel to the driving circuit.*

*20. The display panel of claim 17,*

*wherein the first region and the second region are disposed in a first direction with respect to each other, and*

*wherein the first light-emitting element and the second light-emitting element are disposed on a same line along the first direction with respect to each other.*

*21. The display panel of claim 17,*

*wherein a first color subpixel, a second color subpixel, and a third color subpixel are disposed adjacent one another in a first direction;*

*wherein the first color subpixel, the second color subpixel, and the third color subpixel each includes the first region and the second region disposed with respect to one another in a second direction that crosses the first direction, respectively;*

*wherein the first and second light-emitting elements are configured to emit a same first color are disposed in the first color subpixel;*

*wherein the first and second light-emitting elements are configured to emit a same second color are disposed in the second color subpixel; and*

*wherein the first and second light-emitting elements are configured to emit a same third color are disposed in the third color subpixel.*

*22. The display panel of claim 17, comprising a plurality of power lines, a plurality of scan lines, a reference voltage line, a data line, and a light emitting line in the first region.*

*23. The display panel of claim 22,*

*wherein the first light-emitting element and the second light-emitting element are disposed between the light emitting line and a first scan line of the plurality of scan lines.*

*24. The display panel of claim 22,*

*wherein the first light-emitting element and the driving circuit are disposed between the plurality of power lines.*

*25. The display panel of claim 22, wherein the plurality of power lines include:*

*a first power line to which a first power source is supplied; and*

*a second power line to which a second power source is supplied.*

*26. The display panel of claim 25,*

*wherein the first power source is a high-potential driving voltage,*

*wherein the second power source is a low-potential driving voltage, and*

*wherein a voltage value of the high-potential driving voltage is greater than a voltage value of the low-potential driving voltage.*

*27. The display panel of claim 22, wherein the plurality of scan lines and the light emitting line are disposed parallel to each other in a first direction.*

*28. The display panel of claim 17, wherein the first region further includes the driving circuit.*

*29. The display panel of claim 17, further comprising:*

*a spare region disposed adjacent to at least one of the first light-emitting element and the second light-emitting element.*

*30. The display panel of claim 29, further comprising a third light-emitting element disposed in the spare region.*

*31. The display panel of claim 30, wherein the third light-emitting element is configured to emit light of the same color as the first and second light-emitting elements.*

*32. The display panel of claim 31;*

*wherein a first color subpixel, a second color subpixel, and a third color subpixel are disposed adjacent to each other in the first direction;*

*wherein the first color subpixel, the second color subpixel, and the third color subpixel each includes the first region and the second region in the second direction, respectively;*

*wherein the first and second light-emitting elements configured to emit light of a first color are disposed in the first color region;*

*wherein the first and second light-emitting elements configured to emit light of a second color are disposed in the second color region;*

*wherein the first and second light-emitting elements configured to emit light of a third color are disposed in the third color region;*

*wherein the first subpixel includes a first spare region disposed adjacent to at least one of the first and second light-emitting elements of the first subpixel, the second subpixel includes a second spare region disposed adjacent to at least one of the first and second light-emitting elements of the second subpixel, and the third subpixel includes a third spare region disposed adjacent to at least one of the first and second light emitting elements of the third subpixel.*

*33. The display panel of claim 32, comprising:*

*a third light-emitting element configured to emit the first color disposed in the first spare region;*

*a third light-emitting element configured to emit the second color disposed in the second spare region; and*

*a third light-emitting element configured to emit the third color disposed in the third spare region.*

*34. The display panel of claim 22,*

*wherein the driving circuit includes:*

*a first transistor having a gate electrode connected to one of the plurality of scan lines and a first electrode connected to the data line;*

*a driving transistor having a first electrode connected to a first power line of the plurality of power lines and a gate electrode connected to a second electrode of the first transistor;*

*a capacitor connected between the second electrode of the first transistor and the gate electrode of the driving transistor;*

*a second transistor having a gate electrode connected to one of the plurality of scan lines, a first electrode connected to the gate electrode of the driving transistor, and a second electrode connected to a second electrode of the driving transistor;*

*a third transistor having a first electrode connected to the second electrode of the first transistor and a first electrode of the capacitor; a second electrode connected to a reference voltage line; and a gate electrode connected to the light emitting line; and*

*a fourth transistor having a first electrode connected to the second electrode of the driving transistor; a second electrode connected to a first electrode of the first light-emitting element; and a gate electrode connected to the light emitting line.*

*35. The display panel of claim 34, comprising:*

*a second light-emitting element and a third light emitting element, first electrodes of the second light-emitting element and the third light-emitting element respectively connected in parallel to the second electrode of the fourth transistor;*

*a first e-fuse connected between a second power line of the plurality of power lines and a second electrode of the first light-emitting element; a second e-fuse connected between a second electrode of the second light-emitting element and the second power line; and a third e-fuse connected between a second electrode of the third light-emitting element and the second power line; and*

*a first e-fuse transistor connected to the first e-fuse; a second e-fuse transistor connected to the second e-fuse; and a third e-fuse transistor connected to the third e-fuse.*

*36. The display panel of claim 1, wherein a second element region of the element regions has a second spare region,*

*wherein the second element region includes a second driving circuit,*

*wherein at least two light-emitting diodes are placed in the second element region,*

*wherein the at least two light-emitting diodes include a first and a second light-emitting diodes,*

*wherein both the first and second light-emitting diodes of the second element region are disconnected from the second driving circuit, and*

*wherein the at least two light-emitting diodes include a third light-emitting diode disposed in the second spare region.*

* * * * *